US010957716B2

(12) United States Patent
Yoshida

(10) Patent No.: US 10,957,716 B2
(45) Date of Patent: Mar. 23, 2021

(54) ARRAY SUBSTRATE, LIQUID CRYSTAL DISPLAY PANEL, AND ORGANIC ELECTROLUMINESCENCE DISPLAY PANEL

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/562,493

(22) Filed: Sep. 6, 2019

(65) Prior Publication Data

US 2020/0357825 A1 Nov. 12, 2020

Related U.S. Application Data

(60) Provisional application No. 62/730,017, filed on Sep. 12, 2018.

(51) Int. Cl.
*H01L 27/12* (2006.01)
*H01L 27/32* (2006.01)
(Continued)

(52) U.S. Cl.
CPC .......... *H01L 27/124* (2013.01); *G02F 1/1368* (2013.01); *G02F 1/133345* (2013.01);
(Continued)

(58) Field of Classification Search
CPC .......... G02F 2001/136218; G02F 2001/13685; G02F 2001/13606; G02F 1/136; G02F 1/1362; G02F 1/136227; G02F 1/136286; G02F 1/136209; G02F 2001/134345; H01L 27/3241; H01L 27/326; H01L 27/3244; H01L 27/3262; H01L 27/3258;
(Continued)

(56) References Cited

U.S. PATENT DOCUMENTS

2013/0228777 A1* 9/2013 Yamazaki ........... H01L 27/1214
257/43
2013/0320328 A1 12/2013 Lee et al.
(Continued)

FOREIGN PATENT DOCUMENTS

JP 2013-251526 A 12/2013

*Primary Examiner* — Sonya McCall-Shepard
(74) *Attorney, Agent, or Firm* — Keating & Bennett, LLP

(57) ABSTRACT

An array substrate includes a gate line including a first metal film being arranged on an upper layer side through a first insulating film with respect to a semiconductor film, a source line including a second metal film arranged on a lower layer side through a second insulating film with respect to the semiconductor film and intersecting the gate line, a gate electrode including the first metal film, a channel region including a part of the semiconductor film and superimposing the gate electrode, a source region and a drain region formed by reducing a resistance of a part of the semiconductor film, and a source superimposing line formed by reducing a resistance of a part of the semiconductor film, continued to the source region and having at least one part superimposed with the source line, the source superimposing line being connected to the source line through contact holes opened and formed at a plurality of positions sandwiching the gate line of the second insulating film.

15 Claims, 13 Drawing Sheets

(51) Int. Cl.
*G02F 1/1362* (2006.01)
*G02F 1/1333* (2006.01)
*G02F 1/1368* (2006.01)

(52) U.S. Cl.
CPC .. *G02F 1/136209* (2013.01); *G02F 1/136227* (2013.01); *G02F 1/136286* (2013.01); *H01L 27/3262* (2013.01); *H01L 27/3272* (2013.01); *H01L 27/3276* (2013.01); *H01L 27/3279* (2013.01)

(58) Field of Classification Search
CPC ............. H01L 27/3272; H01L 27/3276; H01L 27/3279; H01L 27/1214; H01L 27/1218; H01L 27/124; H01L 27/1248; H01L 27/1251
See application file for complete search history.

(56) References Cited

U.S. PATENT DOCUMENTS

| | | | |
|---|---|---|---|
| 2015/0301378 A1* | 10/2015 | Ishii | H01L 29/78675 349/110 |
| 2015/0333154 A1 | 11/2015 | Lee et al. | |
| 2015/0333184 A1 | 11/2015 | Lee et al. | |

* cited by examiner

ARRAY SUBSTRATE, LIQUID CRYSTAL DISPLAY PANEL, AND ORGANIC ELECTROLUMINESCENCE DISPLAY PANEL

CROSS REFERENCE TO RELATED APPLICATION

This application claims priority from U.S. provisional patent application No. 62/730,017 filed on Sep. 12, 2018. The entire contents of the priority application are incorporated herein by reference.

TECHNICAL FIELD

The present invention relates to an array substrate, a liquid crystal panel, and an organic Electroluminescence display panel.

BACKGROUND

An array substrate described in Japanese Unexamined Patent Application Publication No. 2013-251526 is conventionally known as an example of an array substrate arranged in a liquid crystal display device. The array substrate described in Japanese Unexamined Patent Application Publication No. 2013-251526 includes a thin-film transistor including a gate electrode, a gate insulating film located above and below the gate electrode, a channel region that overlaps the gate electrode with the gate insulating film in between, and a source region and a drain region located in the same layer as the channel region, connected to the channel region, and opposed to each other with the channel region as a center, where the channel region, the source region, and the drain region include an oxide semiconductor, and a carrier concentration of the source region and the drain region is greater than a carrier concentration of the channel region.

According to the array substrate described in Japanese Unexamined Patent Application Publication No. 2013-251526, a parasitic capacitance between the gate electrode in a top gate type thin-film transistor and the source region or the drain region of the semiconductor layer is reduced. However, if disconnection occurs in a data line connected to the source region, signal provision to the thin-film transistor located ahead of the disconnected area is disabled.

SUMMARY

The present invention has been completed based on such situations, and aims to achieve redundancy of source line.

(1) One embodiment of the present invention relates to an array substrate including a semiconductor film; a first insulating film arranged on an upper layer side of the semiconductor film; a first metal film arranged on an upper layer side of the first insulating film; a second insulating film arranged on a lower layer side of the semiconductor film or an upper layer side of the first metal film; a second metal film arranged on the lower layer side with respect to the semiconductor film through the second insulating film or on the upper layer side with respect to the first metal film through the second insulating film; a gate line including the first metal film; a source line including the second metal film and intersecting the gate line; a gate electrode configuring a thin film transistor, including the first metal film and continuing to the gate line; a channel region configuring the thin film transistor, including a part of the semiconductor film, and being arranged to superimpose the gate electrode; a source region configuring the thin film transistor, being formed by reducing a resistance of a part of the semiconductor film, and continuing to the channel region; a drain region configuring the thin film transistor, being formed by reducing a resistance of a part of the semiconductor film, and continuing from a side opposite to the source region side with respect to the channel region; and a source superimposing line being formed by reducing a resistance of a part of the semiconductor film, continuing to the source region, and having at least one part arranged to superimpose the source line, the source superimposing line being connected to the source line through a plurality of contact holes opened and formed at a plurality of positions sandwiching the gate line of at least the second insulating film.

(2) One embodiment of the present invention relates to the array substrate having the configuration of (1), where the second insulating film is arranged on the lower layer side of the semiconductor film, and the second metal film is arranged on the lower layer side with respect to the semiconductor film through the second insulating film.

(3) One embodiment of the present invention relates to the array substrate having the configuration of (2) that further includes a light shielding portion including the second metal film and being arranged to superimpose at least the channel region.

(4) One embodiment of the present invention relates to the array substrate having the configuration of (3), where the light shielding portion is a lower layer side gate electrode connected to the gate electrode.

(5) One embodiment of the present invention relates to the array substrate having any one of the configurations of (1) to (4), where the source superimposing line includes a gate line non-superimposing portion extending along the source line and not superimposing the gate line, and a gate line superimposing portion continuing to the gate line non-superimposing portion and superimposing the gate line.

(6) One embodiment of the present invention relates to the array substrate having the configuration of (5), where the source superimposing line is formed so that the gate line superimposing portion has a narrower width than the gate line non-superimposing portion.

(7) One embodiment of the present invention relates to the array substrate having any one of the configurations of (1) to (4), where the source superimposing line is arranged to selectively superimpose the source line so as to not superimpose the gate line.

(8) One embodiment of the present invention relates to the array substrate having any one of the configurations of (1) to (7) that further includes a pixel electrode having a long shape in which a longitudinal direction coincides with an extending direction of the source line and being connected to the drain region; where at least a pair of gate lines are arranged to sandwich the pixel electrode from both sides in the longitudinal direction.

(9) One embodiment of the present invention relates to the array substrate having any one of the configurations of (1) to (8), where the gate line has a part of a portion not superimposing the source line and the source superimposing line formed as a wide width part having a wider width than a portion superimposing the source line and the source superimposing line; and the source superimposing line is connected to the source line through a contact hole of the plurality of contact holes arranged at a position adjacent to the wide width part.

(10) Another embodiment of the present invention relates to a liquid crystal panel including the array substrate according to any one of (1) to (9).

(11) Another further embodiment of the present invention relates to an organic Electroluminescence display panel comprising the array substrate according to any one of (1) to (9).

According to the present invention, redundancy of the source line can be achieved.

DETAILED DESCRIPTION

First Embodiment

Figure 4:
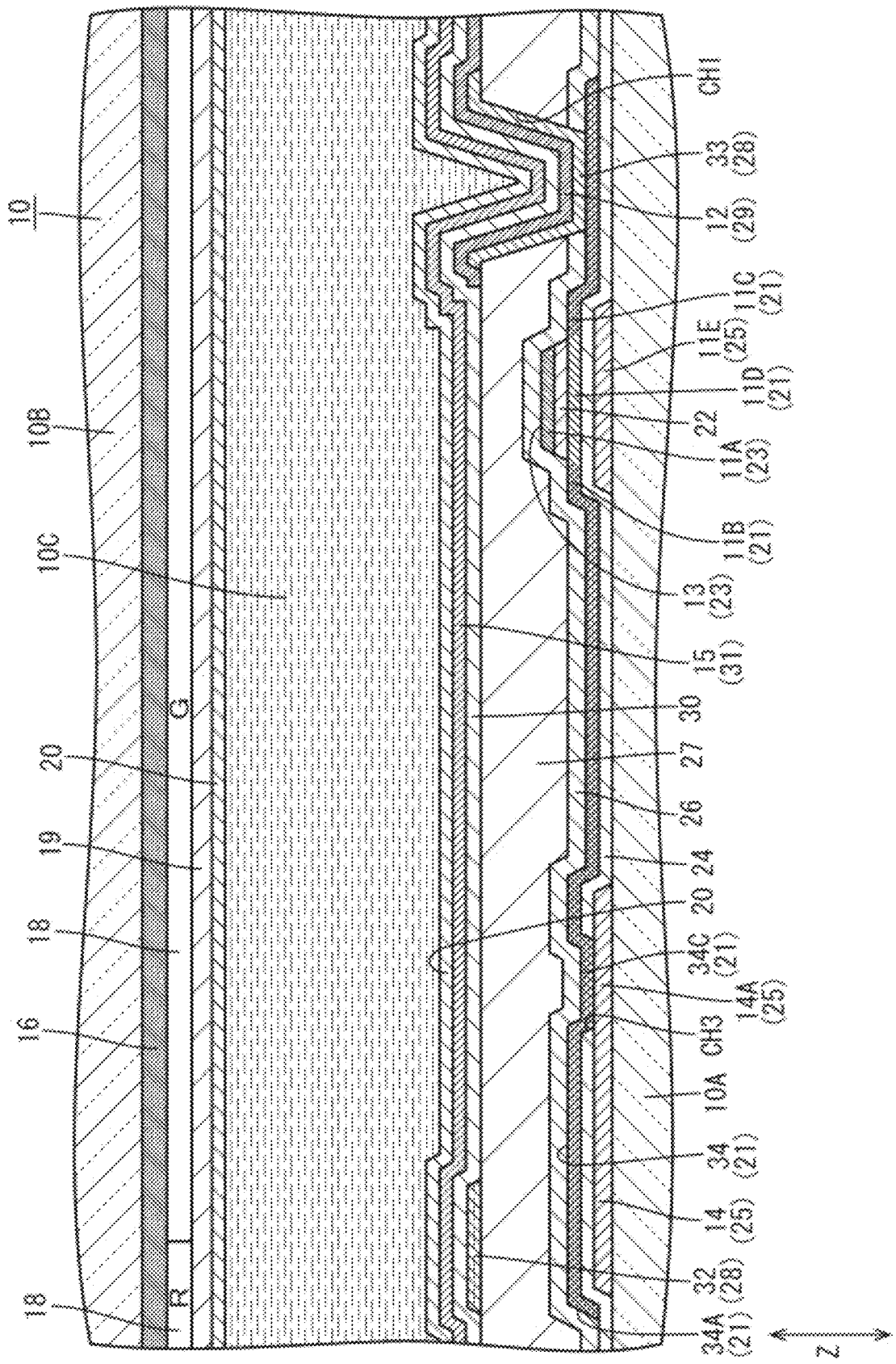
FIG. 4 is a cross-sectional view taken along line A-A of FIG. 3 in the liquid crystal panel.
Figure 5:
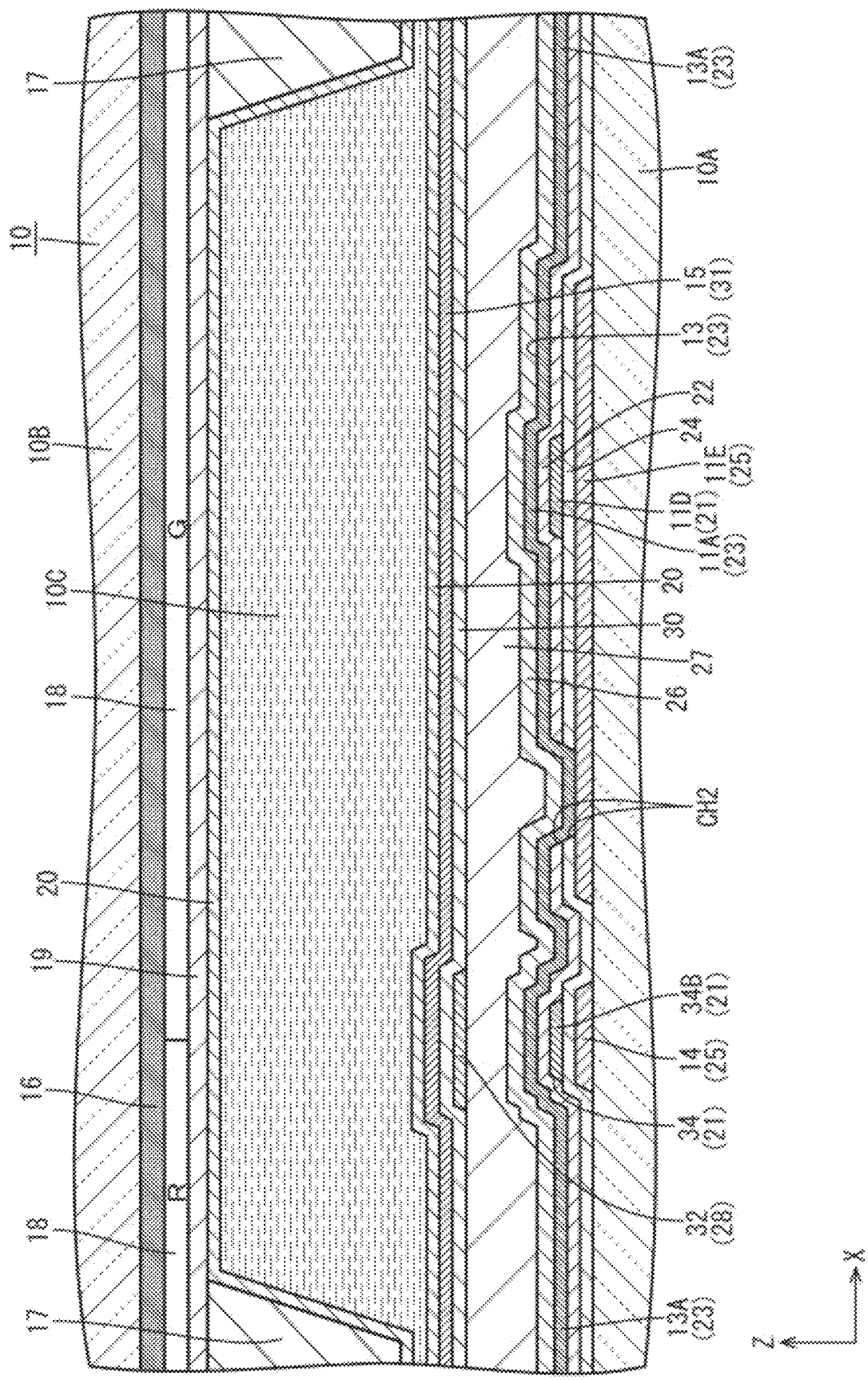
FIG. 5 is a cross-sectional view taken along line B-B of FIG. 3 in the liquid crystal panel.
Figure 6:
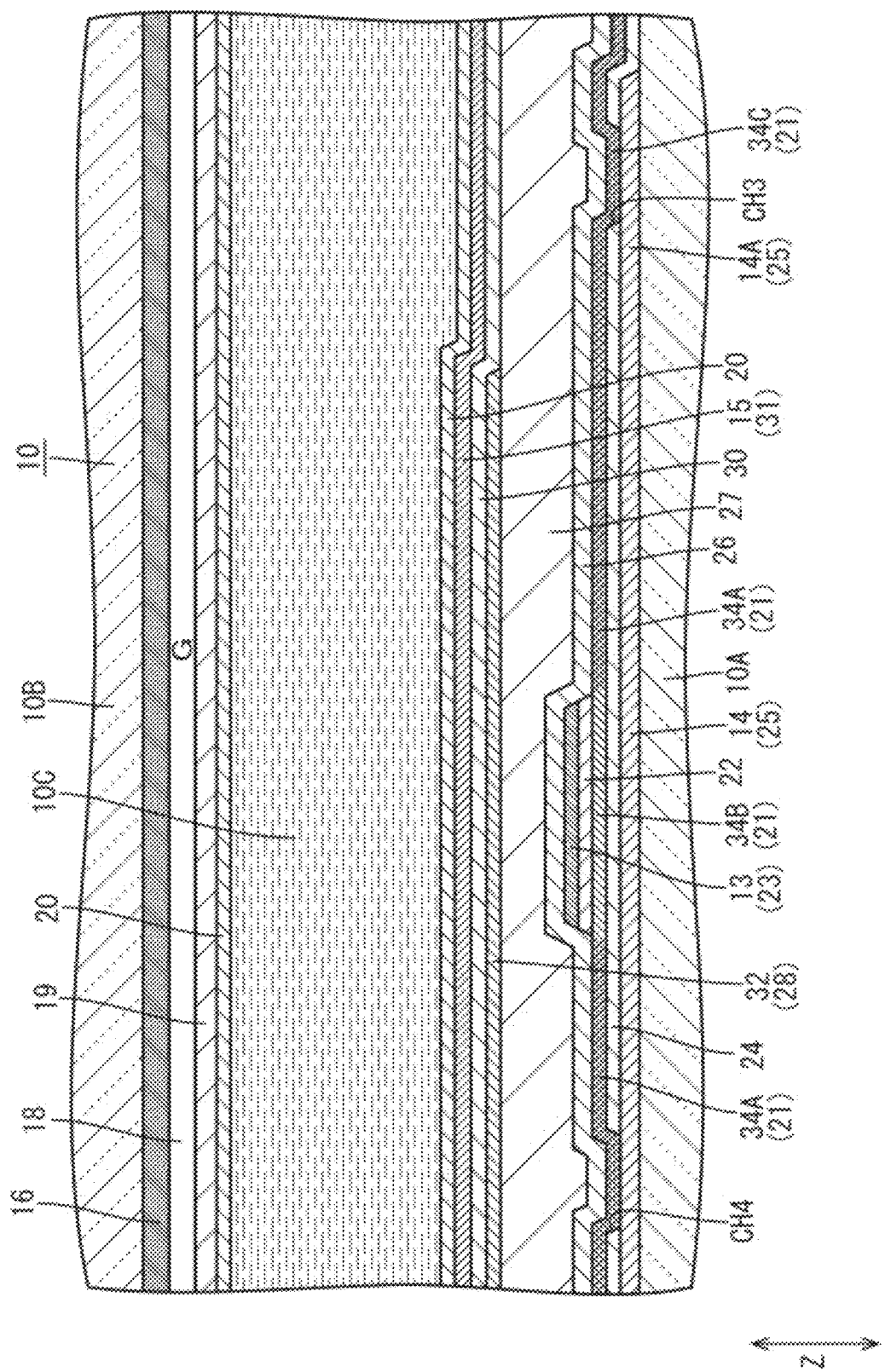
FIG. 6 is a cross-sectional view taken along line C-C of FIG. 3 in the liquid crystal panel.

A first embodiment of the present invention will be described with reference to FIGS. 1 to 6. In the present embodiment, an array substrate 10A configuring a liquid crystal panel (display panel) 10 will be exemplified. At one part of each figure, X axis, Y axis, and Z axis are shown, which are drawn such that each axial direction is the direction indicated in each figure. Furthermore, the upper side in FIGS. 4 to 6 is assumed as the front side, and the lower side is assumed as the back side.

Figure 1:
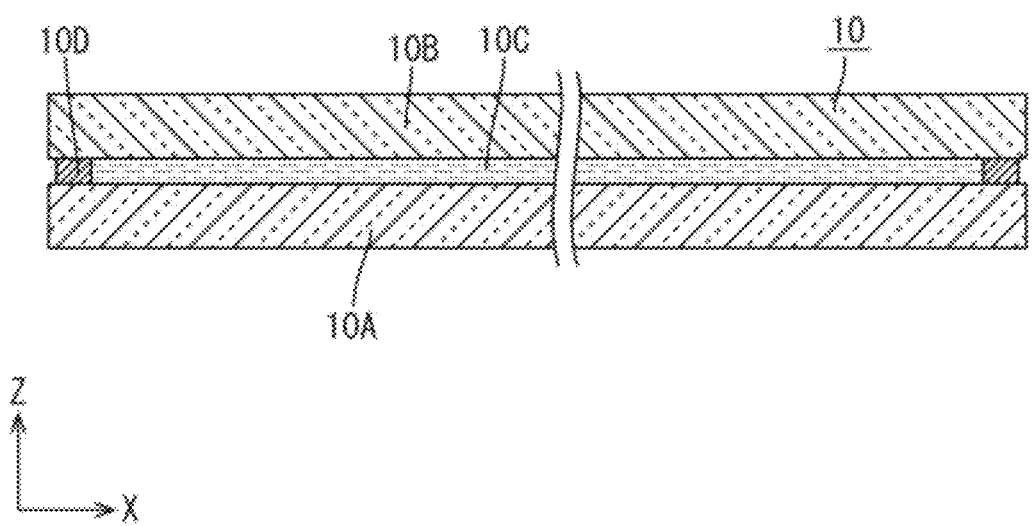
FIG. 1 is a cross-sectional view of a liquid crystal panel according to a first embodiment of the present invention.

FIG. 1 is a schematic cross-sectional view of the liquid crystal panel 10. As shown in FIG. 1, the liquid crystal panel 10 includes the array substrate 10A, a CF substrate (opposing substrate) 10B arranged to face the array substrate 10A, a liquid crystal layer 10C interposed between the substrates 10A, 10B, and a seal portion 10D that surrounds and seals the liquid crystal layer 10C. A polarizing plate (not shown) is attached to the outer surface side of the substrates 10A, 10B.

Figure 2:
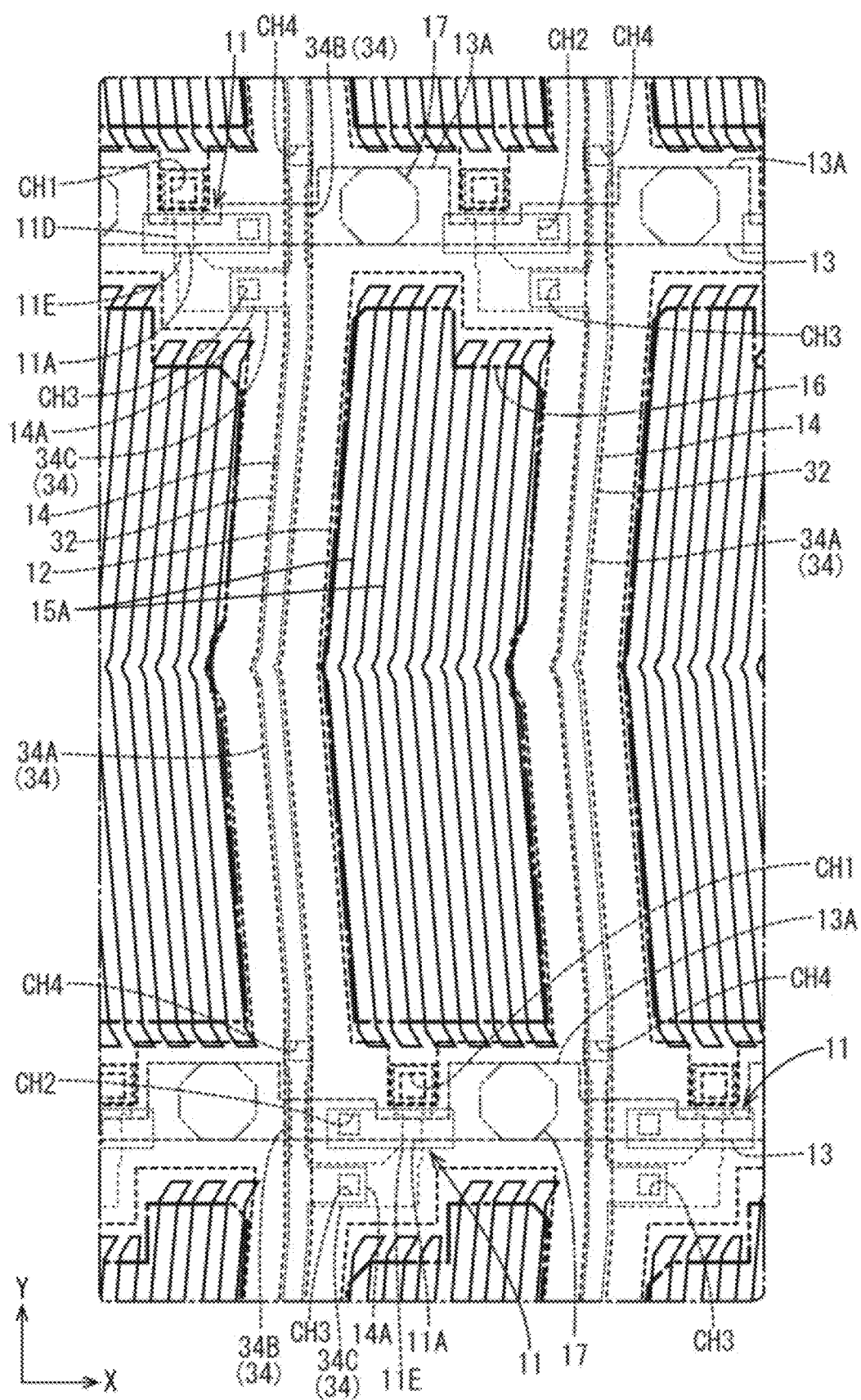
FIG. 2 is a plan view showing a pixel array in an array substrate configuring the liquid crystal panel.

The liquid crystal panel 10 is divided into a display region in which a display surface can display an image and a non-display region that surrounds the display region. FIG. 2 is a plan view of the display region in the array substrate 10A. In FIG. 2, a configuration on the CF substrate 10B side is also partially illustrated. As shown in FIG. 2, in the display region of the array substrate 10A, a TFT (thin film transistor) 11, which is a switching element, and a pixel electrode 12 are provided in a line in plurals in a matrix form (rows and columns). A gate line (scanning line) 13 and a source line (data line, signal line) 14 that form a substantially lattice form are arranged around the TFT 11 and the pixel electrode 12 to surround the same. The gate line 13 is extended along a substantially X axis direction, and the source line 14 is extended along a substantially Y axis direction. The gate line 13 and the source line 14 are connected to a first gate electrode (gate electrode) 11A and a source region 11B of the TFT 11, respectively, and the pixel electrode 12 is connected to a drain region 11C of the TFT 11. The TFT 11 is driven based on various signals provided to the gate line 13 and the source line 14, and the supply of potential to the pixel electrode 12 is controlled accompanying such driving. Furthermore, the TFT 11 is localized on the left and right shown in FIG. 2 in the X axis direction with respect to the pixel electrode 12 (source line 14). The TFT 11 has an array in which one that is localized on the left side with respect to the pixel electrode 12 (source line 14) and one that is localized on the right side with respect to the pixel electrode 12 (source line 14) are alternately and repeatedly lined in the Y axis direction, and is planarly arranged in a zigzag form (staggering form).

As shown in FIG. 2, the pixel electrode 12 is arranged in an elongate substantially rectangular region surrounded by the gate line 13 and the source line 14. The pixel electrode 12 is bent at the middle in the long side direction (longitudinal direction) thereof. The pixel electrode 12 is sandwiched from both sides in the Y axis direction (long side direction) by a pair of gate lines 13, and is sandwiched form both sides in the X axis direction (short side direction) by a pair of source lines 14. A substantially solid-like common electrode 15 is formed in the display region of the array substrate 10A so as to superimpose the pixel electrode 12. In the common electrode 15, a portion that superimposes each pixel electrode 12 is formed with a plurality of (six in FIG. 2) slits 15A extending along the long side direction (Y axis direction) of each pixel electrode 12. When a potential difference occurs between the pixel electrode 12 and the common electrode 15 superimposing each other, a fringe electric field (oblique electric field) including a component of a normal direction with respect to a plate surface of the array substrate 10A is applied to the slit 15A in addition to a component along the plate surface of the array substrate 10A. That is, in the liquid crystal panel 10 including the array substrate 10A according to the present embodiment, the operation mode is the Fringe Field Switching (FFS) mode. A common electrode line 32 extending substantially along the Y axis direction is connected to the common electrode 15 so as to superimpose the source line 14. The common electrode line 32 supplies a common potential to the common electrode 15 and is formed of a material having a lower sheet resistance than the common electrode 15, and thus is suitable for reducing the resistance of the common electrode 15. Furthermore, the CF substrate 10B includes a black matrix (inter-pixel shielding portion) 16 of a substantially lattice form in which a portion that superimposes each pixel electrode 12 is opened. The black matrix 16 is arranged to superimpose the TFT 11, the gate line 13, the source line 14 and the like. Furthermore, the CF substrate 10B includes a spacer 17 for holding the thickness (cell gap) of the liquid crystal layer 10C. The spacer 17 is planarly arranged to superimpose a part of the gate line 13 (wide width part 13A to be described later).

Figure 3:
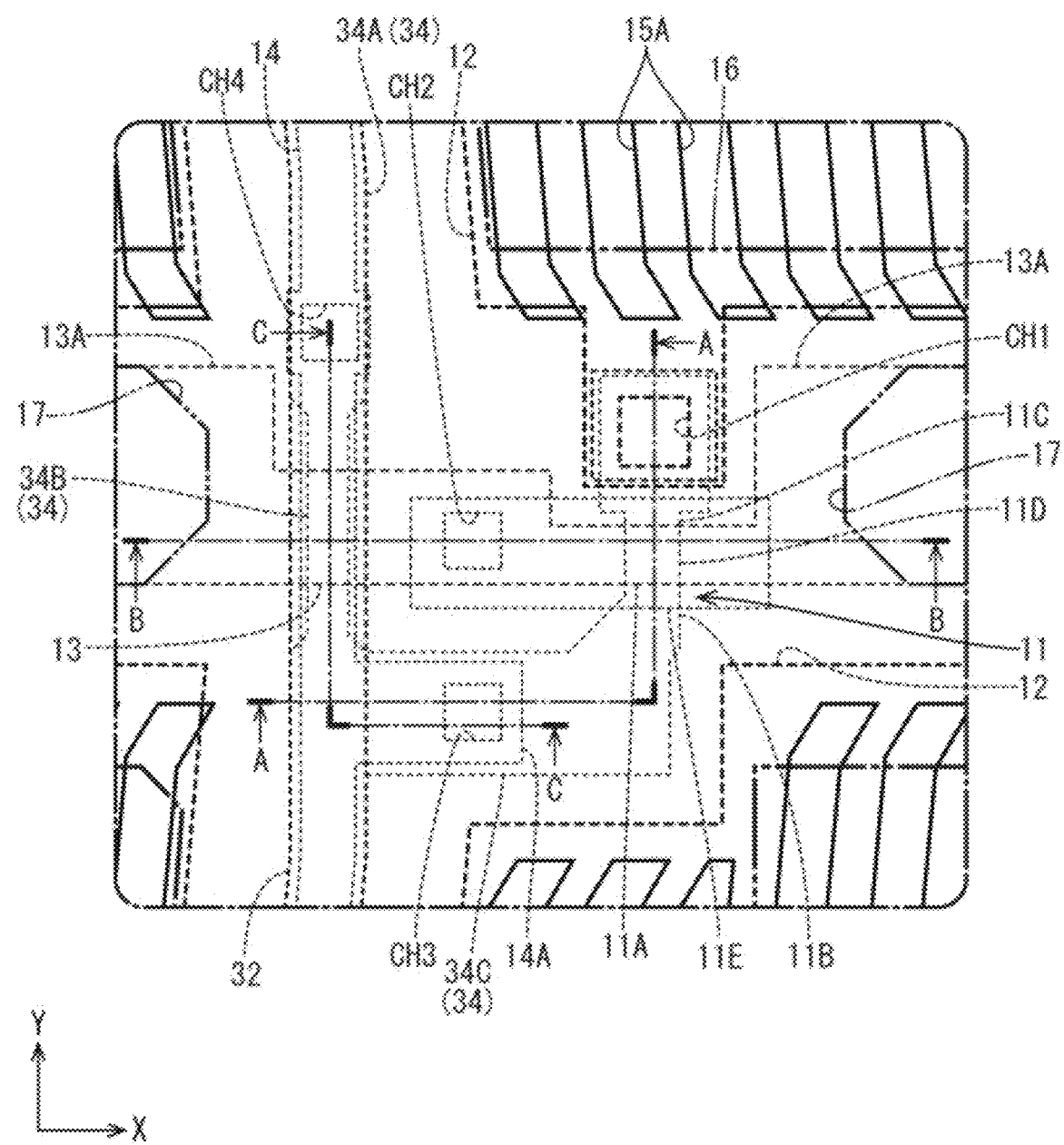
FIG. 3 is a plan view in which the vicinity of a TFT in the array substrate is enlarged.

FIG. 3 is a plan view of the vicinity of the TFT 11 in the array substrate 10A. The configuration of the TFT 11 will be described in detail using FIG. 3. As shown in FIG. 3, the TFT 11 is adjacently arranged on the lower side shown in FIG. 1 in the Y axis direction with respect to the pixel electrode 12, which is the connecting target. The TFT 11 includes a first gate electrode 11A including a part of the gate line 13. In the gate line 13, the line width changes according to the position in the X axis direction and a portion to become the first gate electrode 11A (intersecting site with the channel region 11D) is assumed to have the narrowest width. In the gate line 13, an intersecting site with the source line 14 and a connecting site with the second gate electrode 11E to be described later are assumed to have the second narrowest width, and a portion between the TFT 11 and the source line 14 is a wide width part 13A having the widest width. The spacer 17 is superimposed and arranged in the wide width part 13A, so that a distal end portion of the spacer 17 stably abuts against the innermost surface of the array substrate 10A. The TFT 11 includes a source region 11B connected to the source line 14. The source line 14 includes a plurality of source line branched parts 14A branched from a portion to become the side opposite to the pixel electrode 12 side, which is the connecting target, in the Y axis direction with respect to the portion that intersects the gate line 13. The source line branched part 14A is extended along the X axis direction, and the distal end portion thereof is connected to the source region 11B through a source superimposing line 34 to be described later. The source line branched parts 14A are arranged to line in a zigzag form in accordance with the arrangement of each TFT 11 described above. The TFT 11 includes the drain region 11C arranged with an interval in the Y axis direction with respect to the source region 11B. The drain region 11C has an end on a side opposite to the source region 11B (channel region 11D) side connected to the pixel electrode 12. The TFT 11 includes the channel region 11D that superimposes the first gate electrode 11A and that continues to the source region 11B and the drain region 11C. The channel region 11D is extended along the Y axis direction, and has one end side continued to the source region 11B and the other end side continued to the drain region 11C, respectively. Furthermore, the TFT 11 includes the second gate electrode (light shielding portion, lower layer side gate electrode) 11E arranged to superimpose the first gate electrode 11A and the channel region 11D. The second gate electrode 11E is arranged on the back side with respect to the channel region 11D, that is, on a side opposite to the first gate electrode 11A in the Z axis direction. The second gate electrode 11E is extended along the X axis direction, and has an end on a side opposite to the side of the superimposing site with the channel region 11D connected to the gate line 13. Therefore, a scanning signal transmitted to the gate line 13 is input to the first gate electrode 11A and the second gate electrode 11E at the same timing. Then, when the TFT 11 is driven based on the scanning signal provided to the first gate electrode 11A and the second gate electrode 11E, an image signal (charge) provided to the source line 14 is provided from the source region 11B to the drain region 11C through the channel region 11D. As a result, the pixel electrode 12 is charged to a potential based on the image signal. Furthermore, the second gate electrode 11E can shield the light irradiated from the back side with respect to the channel region 11D. Such light is, for example, the light for display irradiated from a backlight device with respect to the liquid crystal panel 10 and the like. As the light toward the channel region 11D can be shielded by the second gate electrode 11E, the fluctuation in the characteristics of the TFT 11 that may occur when the channel region 11D is irradiated with light can be suppressed.

FIG. 4 is a cross-sectional view taken along line A-A of FIG. 3 in the liquid crystal panel 10. As shown in FIG. 4, in a display region of the CF substrate 10B, a great number of color filters 18 are provided in a line in a matrix form at positions opposing each pixel electrode 12 of the array substrate 10A. The color filters 18 are arranged such that three colors of R (red), G (green) and B (blue) are repeatedly lined in a predetermined order, and configure a pixel, which is a display unit, along with the opposing pixel electrode 12. The black matrix 16 described above is arranged between the adjacent color filters 18, thus preventing color mixing and the like. Furthermore, an overcoat film 19 is formed for flattening on the inner surface side of the color filter 18. The spacer 17 described above is formed on the inner surface side of the overcoat film 19. The spacer 17 projects out toward the array substrate 10A side from the inner surface of the CF substrate 10B along the Z axis direction, and has the distal end portion abutting against or arranged proximate to the innermost surface of the array substrate 10A. An orientation film 20 for orientating the liquid crystal molecules included in the liquid crystal layer 10C is formed on the innermost surface in contact with the liquid crystal layer 10C in the substrates 10A, 10B.

As shown in FIG. 4, the array substrate 10A formed by stacking various films on the inner surface side of a glass substrate (substrate). Each layer arranged on the inner surface side of the array substrate 10A will be described in detail using FIG. 4. Specifically, as shown in FIG. 4, the array substrate 10A at least includes a semiconductor film 21, a first insulating film 22 arranged on an upper layer side of the semiconductor film 21, a first metal film 23 arranged on the upper layer side of the first insulating film 22, a second insulating film 24 arranged on the lower layer side of the semiconductor film 21, and a second metal film 25 arranged on the lower layer side of the second insulating film 24. Furthermore, the array substrate 10A includes a third insulating film 26 arranged on the upper layer side of the first metal film 23, a fourth insulating film 27 arranged on the upper layer side of the third insulating film 26, a third metal film 28 arranged on the upper layer side of the fourth insulating film 27, a first transparent electrode film 29 arranged on the upper layer side of the third metal film 28, a fifth insulating film 30 arranged on the upper layer side of the first transparent electrode film 29, a second transparent electrode film 31 arranged on the upper layer side of the fifth insulating film 30, and the orientation film 20 arranged on the upper layer side of the second transparent electrode film 31.

The first metal film 23, the second metal film 25, and the third metal film 28 are all a single layer film consisting of one type of metal material or a stacked film or alloy consisting of different types of metal materials to have conductivity and light shielding property. As shown in FIG. 4, the first metal film 23 configures the gate line 13, the first gate electrode 11A of the TFT 11 and the like. The second metal film 25 configures the source line 14, the second gate electrode 11E of the TFT 11 and the like. The third metal film 28 configures a common electrode line 32 and the like. The first insulating film 22, the second insulating film 24, and the third insulating film 26 are all formed of $SiO_2$ (oxide, silicon oxide) which is one type of inorganic insulating material (inorganic resin material). The fifth insulating film 30 is formed of $SiN_x$ (silicon nitride) which is one type of inorganic insulating material. The first insulating film 22 is interposed between the semiconductor film 21 and the first metal film 23 to insulating such films. The second insulating film 24 is interposed between the semiconductor film 21 and the second metal film 25 to insulate such films. In particular, a portion in the first insulating film 22 superimposing the first gate electrode 11A maintains an interval between the first gate electrode 11A and the channel region 11D constant, and a portion in the second insulating film 24 superimposing the second gate electrode 11E maintains an interval between the second gate electrode 11E and the channel region 11D constant. The third insulating film 26 covers the semiconductor film 21 and the first metal film 23 from the upper layer side. The fifth insulating film 30 is interposed between the first transparent electrode film 29 and the second transparent electrode film 31 to insulating such films. The fourth insulating film 27 is formed of PMMA (acryl resin) which is one type of organic insulating material (organic material) having photosensitivity, and a film thickness thereof is larger than other insulating films 22, 24, 26, 30 formed of an inorganic resin material. The surface of the array substrate 10A is flattened by the fourth insulating film 27. Among each of the insulating films 22, 24, 26, 27, 30 described above, a pixel contact hole CH1 is opened and formed in the third insulating film 26 and the fourth insulating film 27 so as to superimpose a superimposing area of the drain region 11C of the TFT 11 and the pixel electrode 12. A connecting portion 33 including the third metal film 28 is superimposed and arranged in the pixel contact hole CH1. Therefore, the connection between the drain region 11C and the pixel electrode 12 is achieved through the connecting portion 33 passed through the pixel contact hole CH1. As the pixel contact hole CH1 is covered with the connecting portion 33, the drain region 11C can be prevented from being overetched when the third metal film 28 is etched through a patterned photoresist. In the first insulating film 22 and the second insulating film 24, an inter-gate electrode contact hole CH2 is opened and formed, as shown in FIG. 5, at a position superimposing both the first gate electrode 11A and the second gate electrode 11E of the TFT 11. The connection between the gate electrodes 11A, 11E is achieved by the inter-gate electrode contact hole CH2. Although the illustration is omitted, a common electrode contact hole is opened and formed in the fifth insulating film 30 at a position superimposing both the common electrode 15 and the common electrode line 32. The connection between the common electrode 15 and the common electrode line 32 is achieved by the common electrode contact hole.

The semiconductor film 21 is assumed as an oxide semiconductor film using an oxide semiconductor, for example, as a material. The semiconductor film 21 configures the pixel electrode 12 and the like in addition to the source region 11B, the drain region 11C, and the channel region 11D configuring the TFT 11. A specific material of the semiconductor film 21 includes, for example, In—Ga—Zn—O semiconductor (e.g., indium gallium zinc oxide). The In—Ga—Zn—O semiconductor is a ternary oxide of In (indium), Ga (gallium), and Zn (zinc), where the proportion (composition ratio) of In, Ga and Zn is not particularly limited, and includes, for example, In:Ga:Zn=2:2:1, In:Ga:Zn=1:1:1, In:Ga:Zn=1:1:2 and the like but this is not necessarily the sole case. The In—Ga—Zn—O semiconductor may be amorphous or crystalline, but in the case of crystalline, crystalline In—Ga—Zn—O semiconductor in which c axis is oriented substantially perpendicular to a layer surface is preferable. The first transparent electrode film 29 and the second transparent electrode film 31 are formed of transparent electrode material such as for example, ITO (Indium Tin Oxide) and IZO (Indium Zinc Oxide). The first transparent electrode film 29 configures the pixel electrode 12, and the second transparent electrode film 31 configures the common electrode 15. Thus, the TFT 11 according to the present embodiment is a so-called double gate type in which the channel region 11D including the semiconductor film 21 is sandwiched by the first gate electrode 11A including the first metal film 23 and the second gate electrode 11E including the second metal film 25 from the front and back.

Here, as shown in FIG. 4, the semiconductor film 21 arranged in the array substrate 10A according to the present embodiment has one part formed to have low resistance in the manufacturing process, and thus is configured by a low resistance region and a non-low resistance region. In FIGS. 4 and 6, the low resistance region in the semiconductor film 21 is relatively illustrated in a hatched form. The low resistance region of the semiconductor film 21 has an extremely low resistance of for example, about 1/10000000000 to 1/100, as compared with the non-low resistance region and functions as a conductor. The non-low resistance region in the semiconductor film 21 allows the transfer of charges only under a specific condition (when scanning signal is provided to each gate electrode 11A, 11E), but the low resistance region always allows the transfer of charges and thus functions as a conductor. The channel region 11D and the like are configured by the non-low resistance region of the semiconductor film 21. In addition to the source region 11B and the drain region 11C, the source superimposing line 34 arranged to superimpose the source line 14 (includes source line branched part 14A) is configured by the low resistance region of the semiconductor film 21. The source superimposing line 34 is extended substantially along the Y axis direction so as to be parallel to the source line 14, and superimposes the source line 14 over substantially the entire length. The source superimposing line 34 is connected to the source line 14 through the contact holes CH3, CH4 opened and formed in the second insulating film 24 interposes between the source superimposing line and the second metal film 25. Thus, even if the source line 14 is disconnected in the middle, the transmission of image signals can be maintained by circumventing the source superimposing line 34. Since the source superimposing line 34 is continued to the source region 11B of the TFT 11, the image signal transmitted by the source line 14 can be provided to the source region 11B. The installing number of the source superimposing lines 34 is the same as the installing number of the source lines 14.

In the semiconductor film 21, the low resistance region is partially formed by being selectively subjected to the low resistance process in the manufacturing process of the array substrate 10A. Specifically, as shown in FIG. 4, the low resistance process is carried out with the first metal film 23 arranged on the upper layer side through the first insulating film 22 with respect to the semiconductor film 21 as a mask. That is, only the portion that is not covered by the first metal film 23 in the semiconductor film 21 has lower resistance and the portion that is not covered by the first metal film 23 does not have lower resistance. The first metal film 23 becomes the first gate electrode 11A and the like by being etched with the first insulating film 22 through a photoresist stacked on the upper layer side of the first metal film and exposed and developed to a predetermined pattern. Therefore, in the semiconductor film 21, the channel region 11D which is the portion covered by the first gate electrode 11A is not selectively subjected to lower resistance. A plasma process and the like that uses a predetermined gas is preferable for the low resistance process. As shown in FIG. 5, the first metal film 23 configures the gate line 13 in addition to the first gate electrode 11A, and such gate line 13 intersects the source line 14 including the second metal film 25, so that it is in a relationship of also superimposing the source superimposing line 34 including the semiconductor film 21. That is, the source superimposing line 34 includes a gate line non-superimposing portion 34A which does not superimpose the gate line 13, and a gate line superimposing portion 34B which continues to the gate line non-superimposing portion 34A and superimposes the gate line 13. Therefore, the gate line superimposing portion 34B that superimposes the gate line 13 in the source superimposing line 34 is masked by the gate line 13 when performing the low resistance process, thus becoming the non-low resistance region. Thus, the source superimposing line 34 does not become the low resistance region over the entire region, and if even one part (gate line superimposing portion 34B) becomes the non-low resistance region, the line resistance becomes locally high at the relevant non-low resistance region and bluntness may occur in the transmitted image signal. Thus, when disconnection occurs in the source line 14, the transmission of image signals is maintained by circumventing the source superimposing line 34 but signal bluntness may easily occur and display unevenness on the line may occur.

Thus, as shown in FIG. 2, the source superimposing line 34 arranged in the array substrate 10A according to the present embodiment is connected to the source line 14 through the contact holes CH3, CH4 opened and formed at a plurality of positions sandwiching the gate line 13 of the second insulating film 24. Thus, even if the resistance of the portion superimposing the gate line 13 in the source superimposing line 34 is not reduced and such portion becomes the non-low resistance region, the relevant non-low resistance region can be circumvented by the source line 14. Specifically, when disconnection occurs at areas other than the portion between the plurality of contact holes CH3, CH4 sandwiching the gate line 13, the disconnected area of the source line 14 can be circumvented by the source superimposing line 34, and the gate line superimposing portion 34B that superimposes the gate line 13 and in which the resistance is not reduced in the source superimposing line 34 can be circumvented by the source line 14. Thus, an event in which the line resistance of the source line 14 becomes high by the gate line superimposing portion 34B in which the resistance is not reduced in the source superimposing line 34 is less likely to occur. A plurality of gate line superimposing portions 34B are arranged at constant intervals in the Y axis direction in one source superimposing line 34, where the installing number and the array interval matches the installing number and the array interval of the gate line 13.

Specifically, as shown in FIG. 2, the source superimposing line 34 has a branched structure similar to the source line 14 which is the superimposing target, and includes a source superimposing line branched part 34C that superimposes the source line branched part 14A. The source superimposing line branched part 34C is continued to the source region 11B of the TFT 11. The source superimposing line branched part 34C is a part of the gate line non-superimposing portion 34A same as the source region 11B, and is a low resistance region. As shown in FIGS. 3 and 6, the source superimposing line branched part 34C is adjacently arranged to the gate line 13 in the Y axis direction. In the source superimposing line 34, the source superimposing line branched part 34C is connected to the source line branched part 14A through the first contact hole CH3 of a plurality of contact holes CH3, CH4. Then, a portion adjacent on a side opposite to the source superimposing line branched part 34C side in the Y axis direction with respect to the gate line 13 in the source superimposing line 34 is connected to the source line 14 through a different second contact hole CH4. That is, the contact holes CH3, CH4 are planarly arranged by twos at positions sandwiching each gate line 13 (each gate line superimposing portion 34B) in the Y axis direction. Hereinafter, when distinguishing the two contact holes CH3, CH4 sandwiching the gate line 13, that which superimposes the source superimposing line branched part 34C is referred to as the first contact hole CH3 and that which does not superimpose the source superimposing line branched part 34C is referred to as the second contact hole CH4. The installing number of the contact holes CH3, CH4 with respect to one source superimposing line 34 is twice the installing number of the gate line 13. The second contact hole CH4 which does not superimpose the source superimposing line branched part 34C is adjacently arranged to the wide width part 13A in the gate line 13. Accordingly, compared to a case where a portion that superimposes the source line 14 and the source superimposing line 34 in the gate line 13 is assumed to have the same width as the wide width part 13A, the distance between the two contact holes CH3, CH4 arranged to sandwich the gate line 13 becomes short. Thus, the redundancy of the source line 14 enhances. Furthermore, in the source superimposing line 34, a portion that superimposes the second contact hole CH4 is formed to have a wider width than other portions. Thus, the opening area of the second contact hole CH4 is sufficiently ensured, and the connecting reliability of the source superimposing line 34 and the source line 14 becomes high.

As shown in FIG. 3, the source superimposing line 34 is formed such that the gate line superimposing portion 34B has a narrower width than the gate line non-superimposing portion 34A. Specifically, in the source superimposing line 34, a portion from the branched position of the source superimposing line branched part 34C to the second contact hole CH4 is formed to have a narrower width than the other portions, and such narrow width portion includes the entire region of the gate line superimposing portion 34B and a part of the gate line non-superimposing portion 34A. That is, the narrow width portion of the source superimposing line 34 is configured by the gate line superimposing portion 34B and a portion continuing to both ends of the gate line superimposing portion 34B of the gate line non-superimposing portion 34A. Here, since the gate line superimposing portion 34B in the source superimposing line 34 described above is a non-low resistance region in the semiconductor film 21, when the gate line superimposing portion 34B is irradiated with light from the backlight device and the like, charge transfer may occur in the gate line superimposing portion 34B, in which case, the line resistance of the source superimposing line 34 may fluctuate and the load between the source superimposing line 34 and the gate line 13 may fluctuate. With regards to this, as the gate line superimposing portion 34B of the source superimposing line 34 as described above has a narrower width than the gate line non-superimposing portion 34A, the amount of light the gate line superimposing portion 34B is irradiated is reduced. Thus, the charge transfer involved in the irradiation of light is less likely to occur in the gate line superimposing portion 34B, the line resistance of the source superimposing line 34 is less likely to fluctuate and the load between the source superimposing line 34 and the gate line 13 is less likely to fluctuate.

As shown in FIG. 2, the source superimposing line 34 is connected through at least four contact holes CH3, CH4 arranged at positions each sandwiching a pair of gate lines 13 with respect to the superimposing source line 14. More specifically, the number of contact holes CH3, CH4 connecting each source superimposing line 34 and the source line 14 is double the installing number of the gate line 13 lined along the Y axis direction. According to such a configuration, even if disconnection occurs in the portion extending in a substantially Y axis direction and adjacent to the pixel electrode 12 in the source line 14, the transmission of image signals is maintained by the source superimposing line 34 connected to through the contact holes CH3, CH4. That is, even if disconnection occurs at a majority of the portion excluding the vicinity of the portion intersecting the gate line 13 in the source line 14, the transmission of signals can be maintained and the redundancy of the source line 14 can be sufficiently guaranteed.

As described above, the array substrate 10A of the present embodiment includes the semiconductor film 21, the first insulating film 22 arranged on the upper layer side of the semiconductor film 21, the first metal film 23 arranged on the upper layer side of the first insulating film 22, the second insulating film 24 arranged on the lower layer side of the semiconductor film 21, the second metal film 25 arranged on the lower layer side with respect to the semiconductor film 21 through the second insulating film 24, the gate line 13 including the first metal film 23, the source line 14 including the second metal film 25 and intersecting the gate line 13, the first gate electrode (gate electrode) 11A configuring the TFT (thin film transistor) 11, including the first metal film 23 and continuing to the gate line 13, the channel region 11D configuring the TFT 11, including a part of the semiconductor film 21, and being arranged to superimpose the first gate electrode 11A, the source region 11B configuring the TFT 11, being obtained by reducing the resistance of one part of the semiconductor film 21 and continuing to the channel region 11D, the drain region 11C configuring the TFT 11, being obtained by reducing the resistance of one part of the semiconductor film 21, and continuing from a side opposite to the source region 11B side with respect to the channel region 11D, and the source superimposing line 34 obtained by reducing the resistance of a part of the semiconductor film 21 and continuing to the source region 11B, and in which at least one part is arranged to superimpose the source line 14, the source superimposing line 34 being connected to the source line 14 through the contact holes CH3, CH4 opened and formed at a plurality of positions sandwiching the gate line 13 of at least the second insulating film 24.

Accordingly, when the TFT 11 is driven accompanying the current flow of the first gate electrode 11A continuing to the gate line 13 including the first metal film 23, the charges are transferred through the channel region 11D between the source region 11B and the drain region 11C including the semiconductor film 21. The source superimposing line 34 continuing to the source region 11B including the semiconductor film 21 is superimposed on the source line 14 including the second metal film 25 and connected to the source line 14 through the contact holes CH3, CH4 opened and formed in at least the second insulating film 24. Thus, the signal to be transmitted to the source line 14 is provided to the source region 11B through the source superimposing line 34. The source superimposing line 34 is arranged to superimpose the source line 14, so that even if disconnection occurs in the source line 14, the disconnected area of the source line 14 can be circumvented by the signal being transmitted to the source superimposing line 34. Thus, the redundancy of the source line 14 is achieved. Furthermore, since the second insulating film 24 is interposed between the second metal film 25 and the semiconductor film 21 to insulate such films, the second metal film 25 is suitable for use in configurations (second gate electrode 11E) other than the source line 14.

The source superimposing line 34 is obtained by reducing the resistance of one part of the semiconductor film 21 along with the source region 11B and the drain region 11C. The lower resistance of the semiconductor film 21 is performed with the first gate electrode 11A including the first metal film 23 arranged on the upper layer side with respect to the semiconductor film 21 through the first insulating film 22 as the mask, so that resistance of the channel region 11D superimposing the first gate electrode 11A of the semiconductor film 21 is not reduced selectively. The first metal film 23 configures the gate line 13 in addition to the first gate electrode 11A, and such gate line 13 intersects the source line 14 so as to have a relationship of also superimposing the source superimposing line 34. If a portion superimposing the gate line 13 exists in the source superimposing line 34, such portion is also masked by the gate line 13 and thus may become a portion where resistance is not lowered. With regards to this, as the source superimposing line 34 is connected through the contact holes CH3, CH4 arranged at a plurality of positions sandwiching the gate line 13 with respect to the source line 14 of at least the second insulating film 24, even if a portion superimposing the gate line 13 exists in the source superimposing line 34 as described above and the resistance of such portion is not lowered, the portion where the resistance is not lowered can be circumvented by the source line 14. Specifically, when disconnection occurs in an area other than the portion to become the portion between the plurality of contact holes CH3, CH4 sandwiching the gate line 13 in the source line 14, the disconnected area of the source line 14 is circumvented by the source superimposing line 34, and the portion superimposing the gate line 13 of the source superimposing line 34 and where resistance is not lowered can be circumvented by the source line 14. Thus, an event in which the line resistance of the source line 14 is increased by the portion where resistance is not lowered in the source superimposing line 34 is less likely to occur.

Furthermore, the second insulating film 24 is arranged on the lower layer side of the semiconductor film 21, and the second metal film 25 is arranged on the lower layer side of the semiconductor film 21 through the second insulating film 24. Thus, compared to a case where the second insulating film 24 is arranged on the upper layer side of the first metal film 23 and the second metal film 25 is arranged on the upper layer side of the first metal film 23 through the second insulating film 24, the gate line 13 is not sandwiched by the source line 14 and the source superimposing line 34 at the intersecting portion of the gate line 13 and the source line 14. In other words, the load of the gate line 13 does not increase and the bluntness of the scanning signal (gate signal) can be suppressed.

Furthermore, the second gate electrode 11E which is the light shielding portion including the second metal film 25 and arranged to superimpose at least the channel region 11D is arranged. Even if the semiconductor film 21 is irradiated with light from the lower layer side, the light directed toward the channel region 11D is shielded by arranging the second gate electrode 11E which is the light shielding portion by arranging the second gate electrode 11E which is the light shielding portion including the second metal film 25 arranged on the lower layer side of the semiconductor film 21 through the second insulating film 24 so as to superimpose at least the channel region 11D. Thus, the fluctuation of the characteristics of the TFT 11 that occur when the channel region 11D is irradiated with light can be suppressed. Furthermore, since the second gate electrode 11E which is the light shielding portion includes the second metal film 25 same as the source line 14, the manufacturing cost can be reduced as compared with when there is a need to separately install a metal film for the second gate electrode 11E which is the light shielding portion in a case where the second insulating film 24 is arranged on the upper layer side of the first metal film 23 and the second metal film 25 configuring the source line 14 is arranged on the upper layer side through the second insulating film 24 with respect to the first metal film 23.

The light shielding portion is the second gate electrode (lower layer side gate electrode) 11E connected to the first gate electrode 11A. Accordingly, the signal is provided to the second gate electrode 11E in addition to the first gate electrode 11A, so that the flow amount of charges in the channel region 11D superimposing the second gate electrode 11E can be increased. Furthermore, the fluctuation in the leakage current amount when the TFT 11 is in the OFF state can be suppressed.

Moreover, the source superimposing line 34 includes the gate line non-superimposing portion 34A extending along the source line 14 and non-superimposing the gate line 13, and the gate line superimposing portion 34B continuing to the gate line non-superimposing portion 34A and superimposing the gate line 13. Thus, the source superimposing line 34 is arranged to superimpose the source line 14 without being disconnected. Thus, the redundancy of the source line 14 becomes more satisfactory.

Furthermore, the source superimposing line 34 is formed such that the gate line superimposing portion 34B has a narrower width than the gate line non-superimposing portion 34A. The gate line superimposing portion 34B of the source superimposing line 34 is masked by the superimposing gate line 13 when reducing the resistance of the semiconductor film 21, and thus the resistance is not reduced similar to the channel region 11D. Thus, when light is irradiated on the gate line superimposing portion 34B, charge transfer may occur in the gate line superimposing portion 34B in which case, the line resistance of the source superimposing line 34 may fluctuate and the load between the source superimposing line 34 and the gate line 13 may fluctuate. In regards to this, since the gate line superimposing portion 34B of the source superimposing line 34 has a narrower width than the gate line non-superimposing portion 34A, the amount of light that can be irradiated on the gate line superimposing portion 34B reduces. Thus, the charge transfer involved in the irradiation of light is less likely to occur in the gate line superimposing portion 34B, the line resistance of the source superimposing line 34 is less likely to fluctuate and the load between the source superimposing line 34 and the gate line 13 is less likely to fluctuate.

Furthermore, the pixel electrode 12 having a long shape in which the longitudinal direction coincides with the extending direction of the source line 14 and being connected to the drain region 11C is provided, and at least a pair of gate lines 13 are arranged to sandwich the pixel electrode 12 from both sides in the longitudinal direction. Accordingly, the source superimposing line 34 is connected to the superimposing source line 14 through a plurality of contact holes CH3, CH4 arranged at positions each sandwiching the pair of gate lines 13. Even if disconnection occurs in a portion extending along the longitudinal direction of the pixel electrode 12 and being adjacent to the pixel electrode 12 of the source line 14, the transmission of signals is maintained by the source superimposing line 34 connected through the contact holes CH3, CH4. That is, the transmission of signals can be maintained even if disconnection occurs at a majority of the source line 14, and the redundancy of the source line 14 can be sufficiently guaranteed.

The gate line 13 has one part of a portion non-superimposing the source line 14 and the source superimposing line 34 formed as the wide width part 13A having a wider width than a portion superimposing the source line 14 and the source superimposing line 34, and the source superimposing line 34 is connected to the source line 14 through the contact holes CH3, CH4 included in the plurality of contact holes CH3, CH4 and arranged at positions adjacent to the wide width part 13A. Thus, as compared with the wide width part 13A which is a portion non-superimposing the source line 14 and the source superimposing line 34 of the gate line 13, the portion superimposing the source line 14 and the source superimposing line 34 of the gate line 13 has a narrower width. As the plurality of contact holes CH3, CH4 connecting the source superimposing line 34 and the source line 14 include those arranged at positions adjacent to the wide width part 13A, compared to when a portion superimposing the source line 14 and the source superimposing line 34 of the gate line 13 has the same width as the wide width part 13A, the distance between the plurality of contact holes CH3, CH4 arranged to sandwich the gate line 13 becomes short. The redundancy of the source line 14 is thus further enhanced.

Moreover, the liquid crystal panel 10 according to the present embodiment includes the array substrate 10A described above. According to the liquid crystal panel 10 having such a configuration, an event in which the line resistance of the source line 14 arranged in the array substrate 10A becomes high is less likely to occur, and hence excellent display quality is obtained.

Second Embodiment

A second embodiment of the present invention will be described by FIG. 7 or 8. In the second embodiment, the configuration of the source superimposing line 134 is changed. Redundant description will be omitted on the structure, operation and effect similar to the first embodiment described above.

Figure 7:
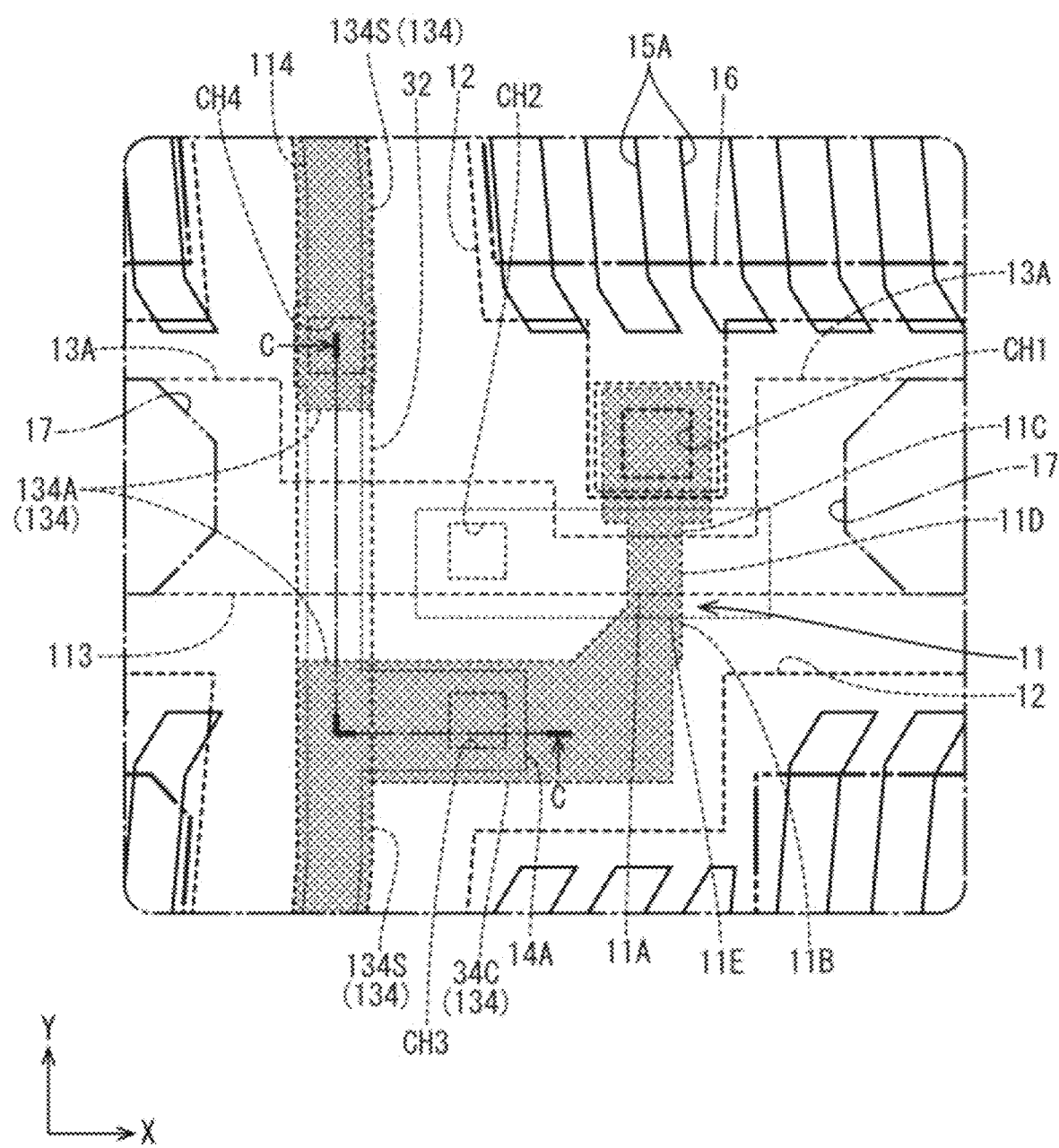
FIG. 7 is a plan view in which the vicinity of a TFT in an array substrate according to a second embodiment of the present invention is enlarged.
Figure 8:
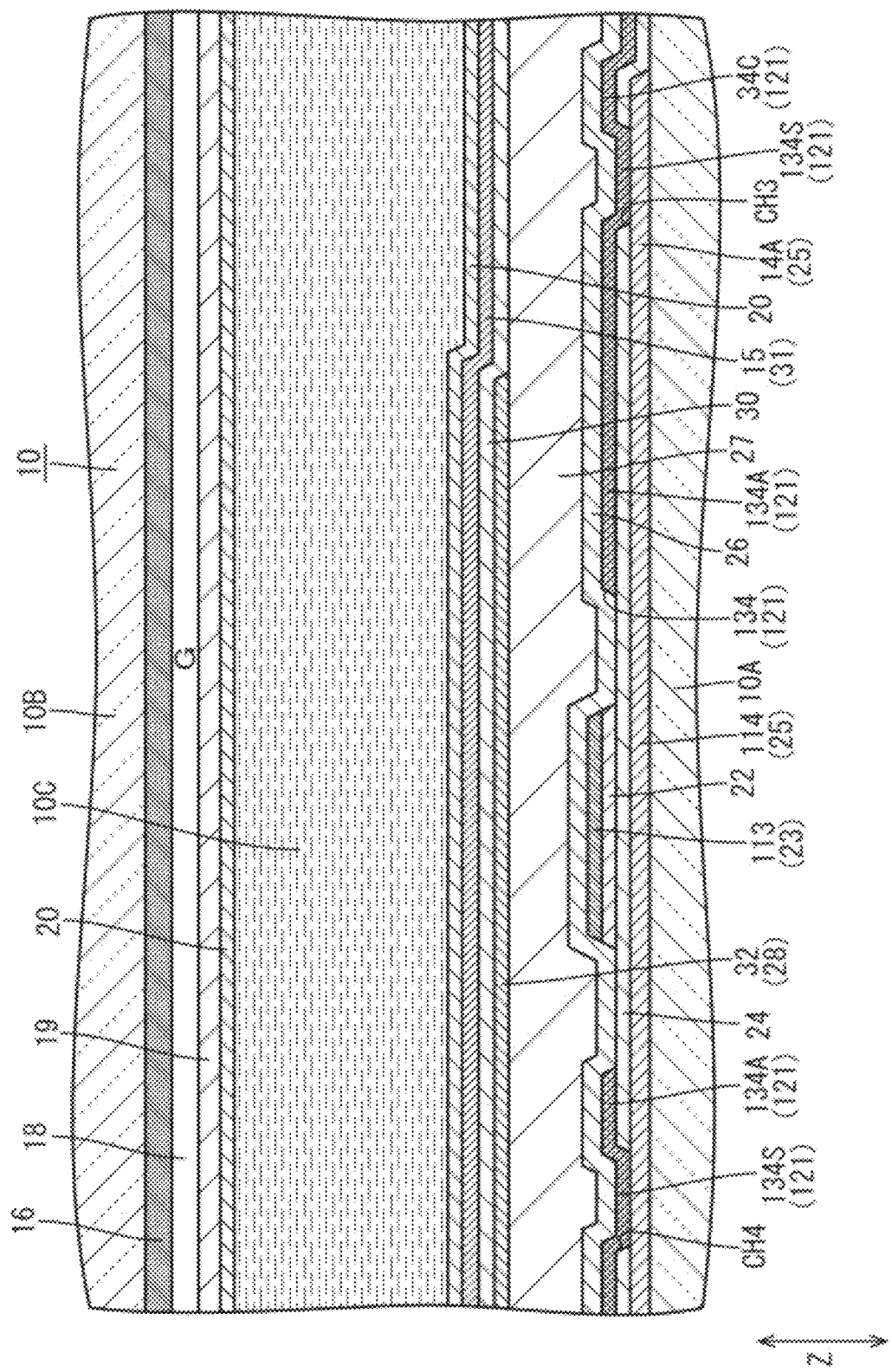
FIG. 8 is a cross-sectional view taken along line C-C of FIG. 7 in the liquid crystal panel.

As shown in FIG. 7, the source superimposing line 134 according to the present embodiment is arranged to selectively superimpose the source line 114 so as not to superimpose the gate line 113. That is, the source superimposing line 134 does not include a portion superimposing the gate line 113 (gate line superimposing portion 34B of the first embodiment), and the entire region configures the gate line non-superimposing portion 134A. In FIG. 7, the source superimposing line 134 is illustrated in a hatched form. Thus, the source superimposing line 134 has a divided structure divided for every plurality of gate lines 113 lined along the Y axis direction. The source superimposing line 134 can be said as being configured by a plurality of divided source superimposing lines 134S. The number of divided source superimposing lines 134S configuring one source superimposing line 134, that is, the divided number of the source superimposing line 134 is the same number as the arranged number of pixel electrode 12 in the Y axis direction. The divided source superimposing lines 134S adjacent in the Y axis direction are connected to the same source line 114 through the two contact holes CH3, CH4 arranged to sandwich the gate line 113. The redundancy of the source line 114 is thus sufficiently guaranteed. Therefore, the source superimposing line 134 is not superimposed on the gate line 113, and thus it can be avoided from being masked by the gate line 113 when selectively reducing the resistance of the semiconductor film 121 in the manufacturing process. Thus, the entire region of the source superimposing line 134 becomes the low resistance region, and the source superimposing line 134 can be avoided from including the non-low resistance region. Thus, even if the source superimposing line 134 is irradiated with light from the backlight device, and the like, charge transfer is avoided from occurring in the source superimposing line 134, and an event in which the line resistance of the source superimposing line 134 fluctuates, an event in which the load between the source superimposing line 134 and the gate line 113 fluctuates and the like are less likely to occur.

According to the present embodiment described above, the source superimposing line 134 is arranged to selectively superimpose the source line 114 so as not to superimpose the gate line 113. Thus, when reducing the resistance of the semiconductor film 121, the source superimposing line 134 does not superimpose the gate line 113 and thus is not masked by the gate line 113. Therefore, a portion in which the resistance is not reduced can be avoided from being included in the source superimposing line 134. Thus, even if the source superimposing line 134 is irradiated with light, the charge transfer can be avoided from occurring in the source superimposing line 134, and an event in which the line resistance of the source superimposing line 134 fluctuates, an event in which the load between the source superimposing line 134 and the gate line 113 fluctuates and the like are less likely to occur. Since the source superimposing line 134 is connected to the source line 114 through the plurality of contact holes CH3, CH4 arranged to sandwich the gate line 113, the redundancy of the source line 114 is sufficiently guaranteed.

Third Embodiment

A third embodiment of the present invention will be described with reference to FIGS. 9 to 13. In the third embodiment, an array substrate 41 arranged in an organic Electroluminescence display panel (organic EL display device) 40 is shown. Redundant description will be omitted on the structure, operation and effect similar to the first embodiment described above.

Figure 9:
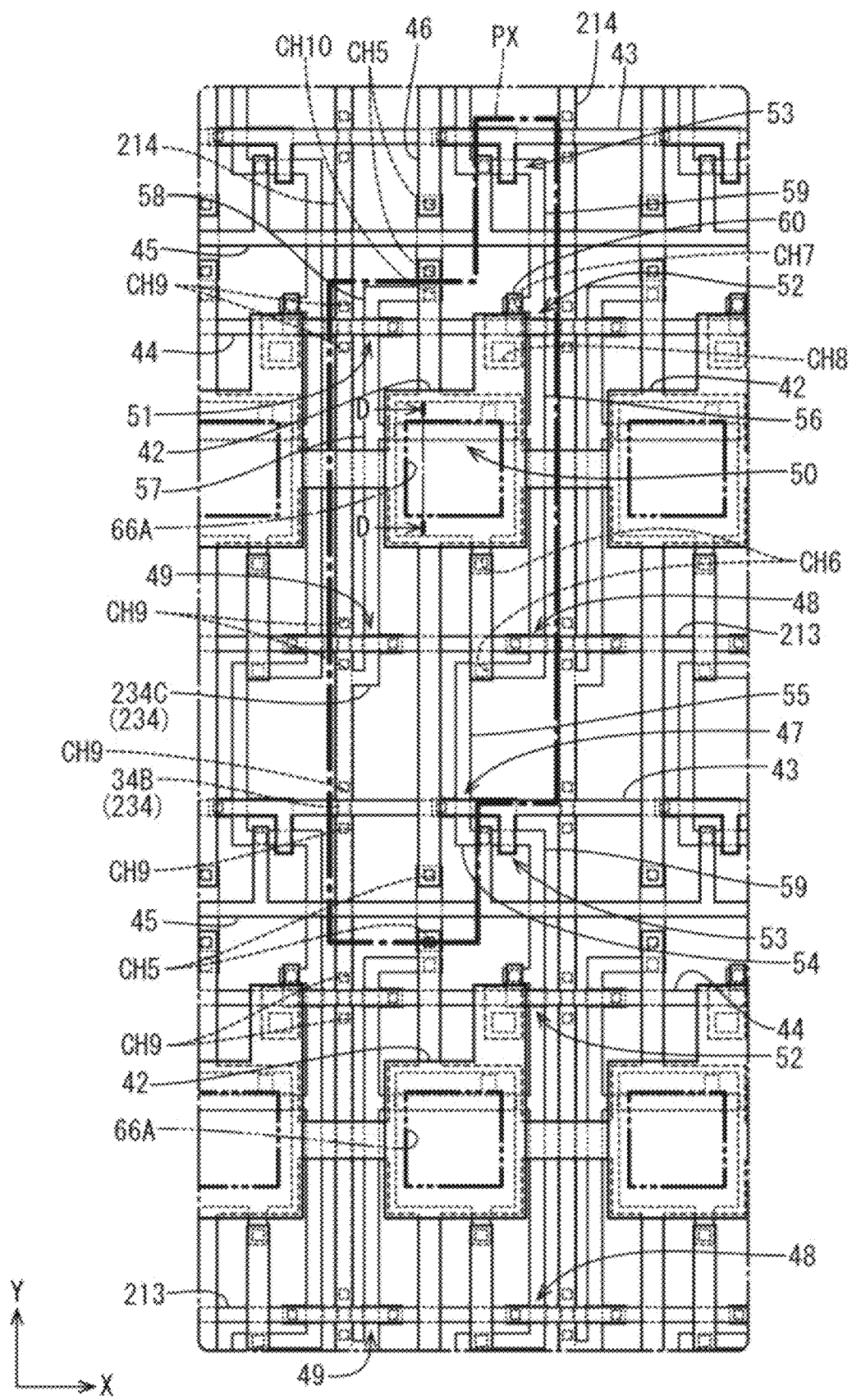
FIG. 9 is a plan view showing a pixel array in an array substrate configuring an organic Electroluminescence display panel according to a third embodiment of the present invention.

As shown in FIG. 9, the organic Electroluminescence display panel 40 according to the present embodiment includes the array substrate 41 formed with various lines and the like. FIG. 9 is a plan view showing a pixel array in the array substrate 41. On the array substrate 41, an organic EL device layer, a cathode side electrode layer, a sealing layer and the like (all of which are not shown) are stacked. The organic EL device layer has a known configuration including a hole injection layer, a hole transport layer, an electron injection layer, an electron transport layer, a light emitting layer and the like. The light emitting layer is sandwiched between the hole transport layer and the electron transport layer, where a light emitting substance contained in the light emitting layer is excited to emit light by the energy generated when the hole and the electron bond with each other in the light emitting layer. The light emitted by the light emitting layer is exit toward a side opposite to the array substrate 41 side in the Z axis direction (thickness direction). That is, the organic Electroluminescence display panel 40 according to the present embodiment is a so-called top emission type. Hereinafter, a detailed configuration of the array substrate 41 will be described.

As shown in FIG. 9, the array substrate 41 is provided with an anode side electrode 42 that configures a pixel PX, which is a display unit. The anode side electrode 42 functions as a "reflection electrode" that reflects the light emitted in the light emitting layer and directs the light toward a side opposite to the array substrate 41 side in the Z axis direction. The anode side electrode 42 has a substantially square shape when viewed in plan view, and a plurality of anode side electrodes 42 are arrayed at intervals in a matrix form along the X axis direction and the Y axis direction. A gate line 213 and a source line 214 are arrayed in plurals so as to partition the anode side electrodes 42. The array substrate 41 is provided with a sub-gate line 43, an EM line 44, and an initialization power supply line 45 extending so as to be parallel to each gate line 213. The sub-gate line 43 and the initialization power supply line 45 are arranged at intervals on a side opposite to the anode side electrode 42 in the Y axis direction with respect to the gate line 213. The initialization power supply line 45 is arranged at intervals on a side opposite to the gate line 213 in the Y axis direction with respect to the sub-gate line 43, and is sandwiched between the sub-gate line 43 and the EM line 44 related to the pixel PX, which scanning order is one before $((n-1)^{th})$. In the present embodiment, the scanning of pixels PX is carried out from the lower side toward the upper side shown in FIG. 9. The EM line 44 is arranged at intervals on a side opposite to the gate line 213 in the Y axis direction with respect to the anode side electrode 42. Furthermore, the array substrate 41 is provided with an anode side power supply line 46 formed to a lattice form extending along the X axis direction and the Y axis direction and arranged to cross all the anode side electrodes 42. The detailed functions and the like of each line 43 to 46 will be described later.

Figure 10:
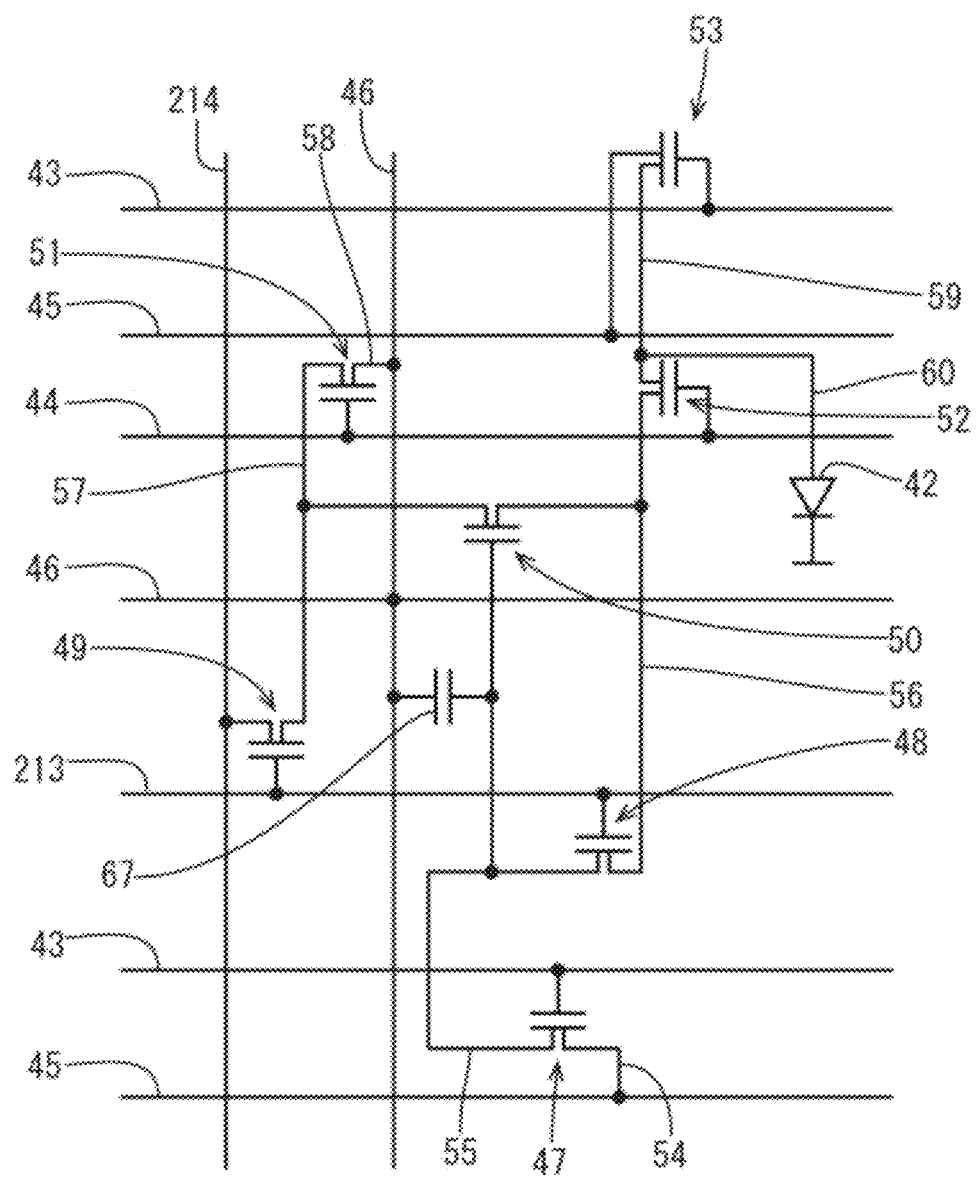
FIG. 10 is a circuit diagram showing an electrical configuration related to a pixel of the array substrate.

As shown in FIGS. 9 and 10, the array substrate 41 is provided with seven TFTs 47 to 53 per one pixel PX to apply voltage to the anode side electrode 42 described above. FIG. 10 is a circuit diagram showing an electrical configuration related to the pixel PX of the array substrate 41. Each of the seven TFTs 47 to 53 includes a first gate electrode, a second gate electrode, a source region, a drain region, and a channel region. The basic configuration of each TFT 47 to 53 according to the present embodiment is similar to the TFT 11 (see FIGS. 3 and 4) described in the first embodiment described above, and indication of reference numerals and the like related to the configuring area of each TFT 47 to 53 are omitted.

As shown in FIGS. 9 and 10, among the seven TFTs 47 to 53, the first TFT 47 has the first gate electrode and the second gate electrode connected to the sub-gate line 43, the source region connected to the first connection line 54, and the drain region connected to the second connection line 55. The second TFT 48 has the first gate electrode and the second gate electrode connected to the gate line 213, the source region connected to the third connection line 56, and the drain region connected to the second connection line 55. The third TFT 49 has the first gate electrode and the second gate electrode connected to the gate line 213 same as the second TFT 48, the source region connected to the source line 214, and the drain region connected to the fourth connection line 57. The fourth TFT 50 has the first gate electrode and the second gate electrode connected to the second connection line 55, the source region connected to the fourth connection line 57, and the drain region connected to the third connection line 56. The fifth TFT 51 has the first gate electrode and the second gate electrode connected to the EM line 44, the source region connected to the fifth connection line 58, and the drain region connected to the fourth connection line 57. The sixth TFT 52 has the first gate electrode and the second gate electrode connected to the EM line 44 same as the fifth TFT 51, the source region connected to the third connection line 56, and the drain region connected to the sixth connection line 59. The seventh TFT 53 has the first gate electrode and the second gate electrode connected to the sub-gate line 43 of the pixel PX which scanning order is one after $((n+1)^{th})$, the source region connected to the first connection line 54 of the pixel PX which scanning order is one after $((n+1)^{th})$, and the drain region connected to the sixth connection line 59.

As shown in FIGS. 9 and 10, the first connection line is connected to the source region of the first TFT 47, the source region of the seventh TFT 53 of the pixel PX which scanning order is one before $((n-1)^{th})$, and the initialization power supply line 45. The second connection line 55 is connected to the drain region of the first TFT 47, the drain region of the second TFT 48, and the first gate electrode and the second gate electrode of the fourth TFT 50. The third connection line 56 is connected to the source region of the second TFT 48, the drain region of the fourth TFT 50, and the source region of the sixth TFT 52. The fourth connection line 57 is connected to the drain region of the third TFT 49, the source region of the fourth TFT 50, and the drain region of the fifth TFT 51. The fifth connection line 58 is connected to the source region of the fifth TFT 51 and the anode side power supply line 46. The sixth connection line 59 is connected to the drain region of the sixth TFT 52, and the drain region of the seventh TFT 53. Furthermore, the array substrate 41 includes the seventh connection line 60 connected to the sixth connection line 59 and the anode side electrode 42.

Figure 11:
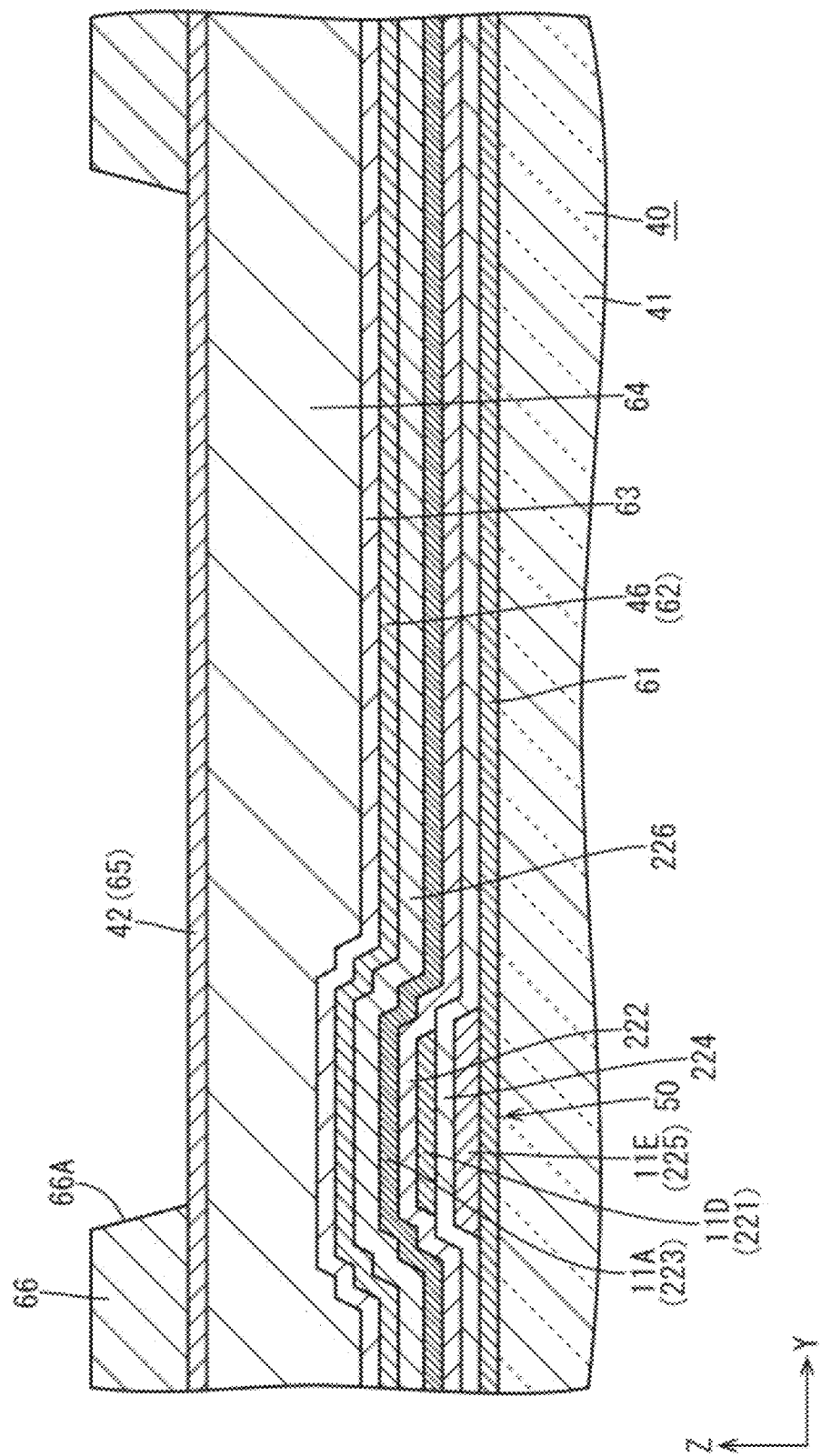
FIG. 11 is a cross-sectional view taken along line D-D of FIG. 9 in the array substrate.

Next, each film stacked on the array substrate 41 will be described using FIG. 11. FIG. 11 is a cross-sectional view of the array substrate 41. As shown in FIG. 11, the array substrate 41 is common with the array substrate 10A (see FIG. 6) configuring the liquid crystal panel 10 described in the first embodiment in that it includes the semiconductor film 221, the first insulating film 222, the first metal film 223, the second insulating film 224, the second metal film 225 and the third insulating film 226. The array substrate 41 according to the present embodiment is different from the first embodiment described above in that it includes a base coat film 61 arranged on the lower layer side of the second metal film 225, a third metal film 62 arranged on the upper layer side of the third insulating film 226, a fourth insulating film 63 arranged on the upper layer side of the third metal film 62, a fifth insulating film 64 arranged on the upper layer side of the fourth insulating film 63, a fourth metal film 65 arranged on the upper layer side of the fifth insulating film 64, and a protective layer 66 arranged on the upper layer side of the fourth metal film 65. The third metal film 62 and the fourth metal film 65 has conductivity and light shielding property by being formed as a single layer film consisting of one type of metal material or as a stacked film or alloy consisting of different types of metal materials. The base coat film 61 and the fourth insulating film 63 are formed of inorganic insulating material similar to the first insulating film 222 and the like. The fifth insulating film 64 is formed of an organic insulating material (organic material) similar to the fourth insulating film 27 (see FIG. 6) described in the first embodiment, and has a film thickness greater than other insulating films 61, 63, 222, 224, 226 consisting of inorganic resin material and has a flattening function. The protective layer 66 consists of an organic insulating material such as polyimide. The protective layer 66 covers the outer peripheral end portion of the anode side electrode 42 but has a portion superimposing the central side portion opened, so that the organic EL device layer is vapor deposited with respect to the anode side electrode 42 through the opening 66A.

Figure 12:
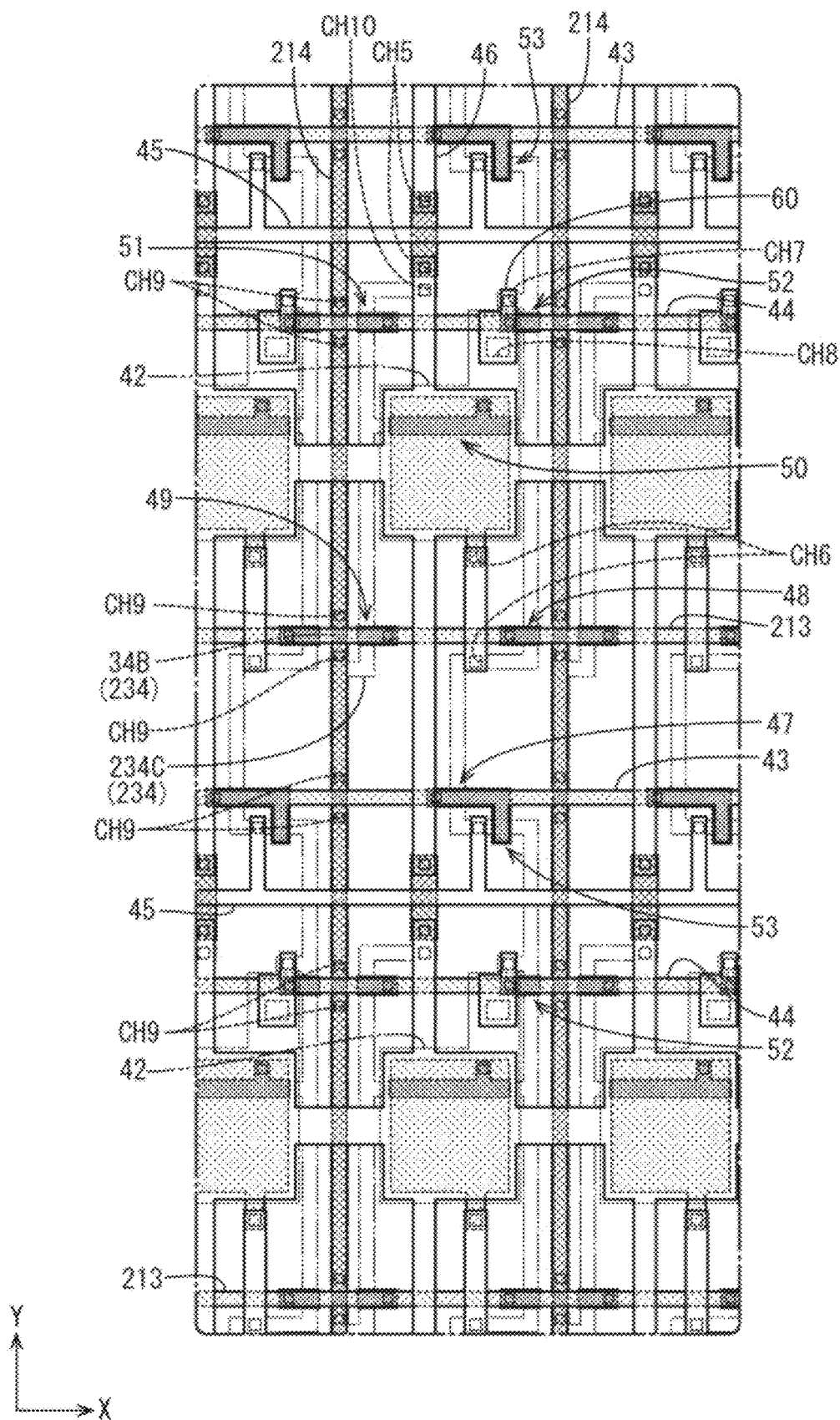
FIG. 12 is a plan view mainly showing a pattern of each metal film arranged in the array substrate.
Figure 13:
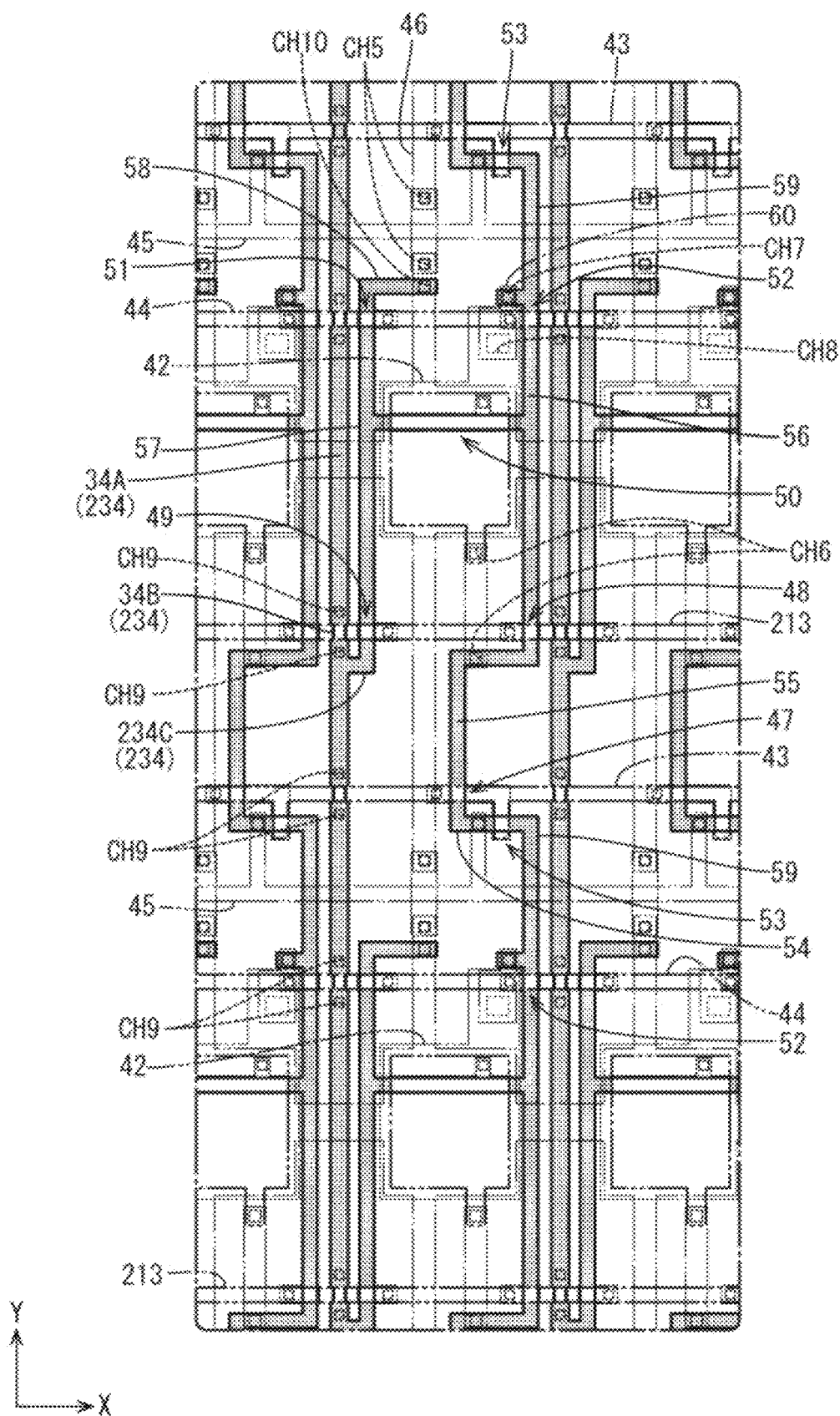
FIG. 13 is a plan view mainly showing a pattern of a semiconductor film arranged in the array substrate.

Next, which structure of the array substrate 41 each metal film 223, 225, 62, 65 and the semiconductor film 221 configures will be described using FIGS. 12 and 13. FIG. 12 is a plan view in which each metal film 223, 225, 62, 65 is shown with a solid line and the semiconductor film 221 is shown with a chain double dashed line. In FIG. 12, the first metal film 223 and the second film 225 are shown with different hatching. FIG. 13 is a plan view in which the semiconductor film 221 is shown with a solid line and each metal film 223, 225, 62, 65 is shown with a chain double dashed line. In FIG. 13, the low resistance region in the semiconductor film 221 is shown in a hatched form and the non-low resistance region is shown in an outlined form. In the present embodiment, as shown in FIG. 12, the first metal film 223 configures the gate line 213, the sub-gate line 43, and the EM line 44, and configures the first gate electrode of the fourth TFT 50. The first gate electrode of the fourth TFT 50 is smaller than the anode side electrode 42 but is planarly arranged to superimpose a majority of the anode side electrode 42. A part of the gate line 213 configures each of the first gate electrodes of the second TFT 48 and the third TFT 49, a part of the sub-gate line 43 configures each of the first gate electrodes of the first TFT 47 and the seventh TFT 53, and a part of the EM line 44 configures each of the first gate electrodes of the fifth TFT 51 and the sixth TFT 52. The second metal film 225 configures each of the second gate electrodes and the source lines 214 of each TFT 47 to 53 and configures a part of the anode side power supply line 46 (portion intersecting the initialization power supply line 45). The third metal film 62 configures a majority of the anode side power supply line 46 (portion intersecting the initialization power supply line 45), the initialization power supply line 45, a part of the second connection line 55 (portion intersecting gate line 213), and a part of the seventh connection line 60 (portion intersecting the EM line 44). The anode side power supply line 46 includes a square portion superimposed with respect to the anode side electrode 42 and the first gate electrode of the fourth TFT 50, where the relevant portion is smaller than the anode side electrode 42 but larger than the first gate electrode of the fourth TFT 50. Thus, a retention volume 67 is formed between the anode side power supply line 46 and the first gate electrode of the fourth TFT 50. The anode side power supply line 46 has a portion including the third metal film 62 and a portion including the second metal film 225 connected through the first inter-line contact hole CH5 opened and formed in the first insulating film 222, the second insulating film 224, and the third insulating film 226. The seventh connection line 60 has a portion including the third metal film 62 superimposing a majority of the anode side electrode 42 intersecting the EM line 44. The fourth metal film 65 exclusively configures the anode side electrode 42.

As shown in FIG. 13, the semiconductor film 221 configures each of the source region, the drain region, and the channel region of each TFT 47 to 53, and configures the source superimposing line 234 and further configures a majority of each connection line 54 to 60. Specifically, the first connection line 54, the third connection line 56, the fourth connection line 57, the fifth connection line 58, and the sixth connection line 59 have the respective entire region including the low resistance region of the semiconductor film 221 in a manner not superimposing the first metal film 223. The second connection line 55 includes the low resistance region of the semiconductor film 221 excluding a portion including the third metal film 62 intersecting the gate line 213, and has a portion including the third metal film 62 and a portion including the low resistance region of the semiconductor film 221 connected through a second inter-line contact hole CH6 opened and formed in the third insulating film 226. The seventh connection line 60 has a portion branched from the sixth connection line 59 including the low resistance region of the semiconductor film 221 and has a portion including the low resistance region of the semiconductor film 221 and other portions including the third metal film 62 connected through a third inter-line contact hole CH7 opened and formed in the third insulating film 226. Furthermore, in the seventh connection line 60, a portion including the third metal film 62 and a part of the anode side electrode 42 including the fourth metal film 65 (portion projecting out toward the sixth TFT 52 side in the Y axis direction) are connected through an electrode contact hole CH8 opened and formed in the fourth insulating film 63 and the fifth insulating film 64. Furthermore, the fifth connection line 58 is connected to a portion including the third metal film 62 of the anode side power supply line 46 through a fourth inter-line contact hole CH10 opened and formed in the third insulating film 226.

As shown in FIGS. 12 and 13, the source superimposing line 234 arranged in the array substrate 41 according to the present embodiment is connected to the source line 214 through the contact hole CH9 opened and formed at a plurality of positions sandwiching the gate line 213, the sub-gate line 43 and the EM line 44, all of which include the first metal film 223, of the second insulating film 224. Specifically, the contact hole CH9 according to the present embodiment is arranged at two positions sandwiching the gate line 213, two positions sandwiching the sub-gate line 43, and two positions sandwiching the EM line 44 when seen in plan view. Therefore, the installing number of contact holes CH9 per one source line 214 coincides with six times the arranged number of anode side electrodes 42 (pixels PX) in the Y axis direction. The present embodiment differs from the first embodiment in that the contact hole CH9 is not arranged in the source line branched part 214A and the source superimposing line branched part 234C of the source line 214 and the source superimposing line 234. According to such a configuration, operations and effects similar to the first embodiment described above can be obtained. In other words, even if the resistance of a portion that superimposes each of the gate line 213, the sub-gate line 43 and the EM line 44 in the source superimposing line 234 is not reduced and such a portion becomes a non-low resistance region, the non-low resistance region can be circumvented by the source line 214 and an event in which the line resistance of the source line 214 becomes high is less likely to occur.

The operations related to the organic EL display device 40 having such a configuration will be described using FIGS. 9 and 10. First, an OFF signal is input to the EM line 44 related to the n$^{th}$ pixel PX. The fifth TFT 51 and the sixth TFT 52 related to the n$^{th}$ pixel PX are then in the OFF state (non-driven state). The scanning signal is provided at the same timing to the gate line 213 related to the (n−1)$^{th}$ (scanning order is one before) pixel PX and the sub-gate line 43 related to the n$^{th}$ pixel PX. At this time, the first TFT 47 related to the n$^{th}$ pixel PX is driven, and thus the initialization power supply line 45 and the second connection line 55 are conducted. Then, the initialization signal transmitted by the initialization power supply line 45 is passed through the source region, the channel region and the drain region of the first TFT 47, and furthermore, provided to the first gate electrode and the second gate electrode of the fourth TFT 50 through the second connection line 55. The initialization signal has a potential exceeding the threshold value voltage of the fourth TFT 50, and thus the fourth TFT 50 is in a driven state. At this time, the third connection line 56 and the fourth connection line 57 are conducted. Thereafter, the OFF signal is input to the sub-gate line 43 related to the n$^{th}$ pixel PX, and thus the first TFT 47 related to the n$^{th}$ pixel PX is in the OFF state. Since the second TFT 48 is in the OFF state, the initialization signal provided to the second connection line 55 is not provided to the third connection line 56. Furthermore, an image signal is provided to the source line 214 related to the (n−1)$^{th}$ pixel PX, and thereafter, a light emission control signal is provided to the EM line 44 related to the (n−1)$^{th}$ pixel PX.

Next, the scanning signal is provided at the same timing to the gate line 213 related to the n$^{th}$ pixel PX and the sub-gate line 43 related to the (n+1)$^{th}$ (scanning order is one after) pixel PX. At this time, the second TFT 48 and the third TFT 49 related to the n$^{th}$ pixel PX are driven, and thus the source line 214 and the fourth connection line 57 are conducted and the third connection line 56 and the second connection line 55 are conducted. When the image signal is provided to the source line 214 at this timing, the image signal is transmitted from the source line 214 to the fourth connection line 57. At this time, the fourth TFT 50 is driven based on the initialization signal provided to the first gate electrode and the second gate electrode, and the potential of the first gate electrode and the second gate electrode is held by the retention volume 67 formed with the anode side power supply line 46. Therefore, the image signal transmitted to the fourth connection line 57 is provided to the third connection line 56 through the source region, the channel region and the drain region of the fourth TFT 50. The image signal transmitted to the third connection line 56 is provided to the second connection line 55 through the source region, the channel region, and the drain region of the second TFT 48. The image signal transmitted to the second connection line 55 is provided to the first gate electrode and the second gate electrode of the fourth TFT 50. The first gate electrode and the second gate electrode of the fourth TFT 50 are held at the potential related to the image signal by the retention volume 67 described above. Thereafter, the OFF signal is input to the gate line 213 related to the n$^{th}$ pixel PX. Furthermore, as the seventh TFT 53 related to the n$^{th}$ pixel PX is driven by providing the scanning signal to the sub-gate line 43 related to the (n+1)$^{th}$ pixel PX, the sixth connection line 59 and the seventh connection line 60 are conducted to the initialization power supply line 45. The anode side electrode 42 related to the n$^{th}$ pixel PX thereby becomes the potential related to the initialization signal.

Thereafter, the light emission control signal is provided to the EM line 44 related to the n$^{th}$ pixel PX. The light emission control signal has a potential exceeding the threshold value voltage of the fifth TFT 51 and the sixth TFT 52, and thus the fifth TFT 51 and the sixth TFT 52 are in a driven state. At this time, the fourth connection line 57 and the fifth connection line 58 are conducted, and the third connection line 56 and the sixth connection line 59 as well as the seventh connection line 60 are conducted. Since the fifth connection line 58 is connected to the anode side power supply line 46, the power supply signal transmitted to the anode side power supply line 46 is provided to the fourth connection line 57 through the source region, the channel region, and the drain region of the fifth TFT 51 from the fifth connection line 58. The power supply signal transmitted to the fourth connection line 57 is provided to the third connection line 56 through the source region, the channel region, and the drain region of the fourth TFT 50. At this time, the power supply signal provided to the third connection line 56 has a potential of the first gate electrode and the second gate electrode of the fourth TFT 50, that is, a potential based on the image signal provided to the source line 214. The power supply signal adjusted to the potential based on the image signal provided to the source line 214 in such a manner is provided to the sixth connection line 59 and the seventh connection line 60 through the source region, the channel region and the drain region of the sixth TFT from the third connection line 56, and then provided to the anode side electrode 42. The anode side electrode 42 thus has a potential based on the image signal provided to the source line 214, and hence the light emitting layer of the organic EL device layer connected to the anode side electrode 42 emits light of a quantity corresponding to the relevant potential. Thereafter, when the OFF signal is input to the EM line 44 related to the $n^{th}$ pixel PX, the fifth TFT 51 and the sixth TFT 52 are in the OFF state and the light emission of the light emitting layer of the organic EL device layer is stopped. Therefore, the light emitting period of the light emitting layer becomes the period from the input of the light emission control signal to the input of the OFF signal to the EM line 44 related to the $n^{th}$ pixel PX. That is, the light emitting period and the non-light emitting period of the light emitting layer can be controlled by adjusting the timing to input the light emission control signal and the OFF signal to the EM line 44.

As described above, the organic Electroluminescence display panel 40 according to the present embodiment includes the array substrate 41 described above. According to the organic Electroluminescence display panel 40 having such a configuration, an event in which the line resistance of the source line 214 arranged in the array substrate 41 becomes high is less likely to occur, and thus excellent display quality is obtained.

Other Embodiments

The present invention is not limited to the embodiments described in detail above and in the drawings, and for example, the following embodiments are also encompassed in the technical scope of the present invention.

(1) In each embodiment described above, a configuration in which the second metal film is arranged on the lower layer side with respect to the semiconductor film by way of the second insulating film has been shown, but a configuration in which the second metal film is arranged on the upper layer side with respect to the first metal film by way of the second insulating film may be adopted. In this case as well, the contact hole for connecting the source line including the second metal film and the source superimposing line including the semiconductor film is opened and formed in the second insulating film. That is, the source superimposing line is connected to the source line through the contact hole opened and formed at a plurality of positions crossing the gate line of the second insulating film. Furthermore, in this case, the third metal film can be configured to be arranged on the upper layer side with respect to the second metal film by way of the third insulating film. A configuration in which the third metal film is arranged on the lower layer side with respect to the semiconductor film by way of the third insulating film may be adopted.

(2) In each embodiment described above, a configuration in which the contact hole for connecting the source line and the source superimposing line is arranged by twos at positions sandwiching the gate line has been shown, but the contact hole may be arranged by threes or more at positions sandwiching the gate line.

(3) In each embodiment described above, a case in which the gate line superimposing portion in the source superimposing line has a narrower width than the gate line non-superimposing portion has been shown, but the gate line superimposing portion and the gate line non-superimposing portion may have the same width.

(4) In the first and second embodiments described above, a configuration in which the first gate electrode and the second gate electrode configuring the TFT are directly connected through the inter-gate electrode contact hole has been shown, but for example, a configuration in which the first gate electrode and the second gate electrode are connected through an inter-gate electrode connecting portion including the third metal film may be adopted. In this case, the inter-gate electrode connecting portion may be arranged to superimpose both the first gate electrode and the second gate electrode, the first inter-gate electrode contact hole may be opened and formed for connecting them to the position superimposing the first gate electrode and the inter-gate electrode connecting portion of the third insulating film and the fourth insulating film, and the second inter-gate electrode contact hole may be opened and formed for connecting them to the position superimposing the second gate electrode and the inter-gate electrode connecting portion of the second insulating film, the third insulating film, and the fourth insulating film.

(5) In the first and second embodiments described above, a case where the first gate electrode configuring the TFT is connected to the second gate electrode including the second metal film has been shown, but the second gate electrode may not be connected to the first gate electrode. In this case, the second gate electrode does not configure the TFT and becomes the "light shielding portion" having a light shielding function with respect to the channel region. Furthermore, the second gate electrode (light shielding portion) can be omitted.

(6) In the first and second embodiments described above, a liquid crystal display device that does not have the touch panel function is shown, but a liquid crystal display device incorporating the touch panel function may be adopted. In this case, the common electrode may be partitioned by a plurality of touch electrodes, a plurality of common electrode lines including the third metal film may be installed so as to be connected to the plurality of touch electrodes and then the common potential signal may be provided in the display period of displaying image with respect to each common electrode line and the touch signal may be provided in the sensing period of performing touch detection in a time divided manner.

(7) In the first and second embodiments described above, a case where the connecting portion including the third metal film is arranged to superimpose the pixel contact hole has been shown, but the connecting portion may be omitted. Furthermore, the common electrode line including the third metal film may be omitted. Moreover, if the common electrode line and the connecting portion are not installed, the third metal film itself may be omitted.

(8) In the first and second embodiments described above, a case where the pixel electrode includes a transparent electrode film has been shown, but the pixel electrode may be configured by a part of the low resistance region of the semiconductor film. In this case, the pixel electrode is directly continued to the drain region of the TFT including the same low resistance region, and the pixel contact hole becomes unnecessary. Furthermore, in this case, one of the two transparent electrode films becomes unnecessary, and the insulating film (third insulating film and the fourth insulating film) interposing the pixel electrode and the first metal film becomes unnecessary. That is, only the transparent electrode film configuring the common electrode may be formed.

(9) In the first and second embodiments described above, a case where the TT is planarly arranged in a zigzag form in the array substrate has been shown, but the TFT may be planarly arranged in a matrix form.

(10) In the third embodiment described above, a case where the TFT is planarly arranged in a matrix form in the array substrate has been shown but the TFT may be planarly arranged in a zigzag form.

(11) In the first and second embodiments described above, a case where the line width of the gate line changes in the middle has been shown, but the line width of the gate line may be substantially constant.

(12) Other than the first and second embodiments described above, the display mode of the liquid crystal panel may be TN mode, VA mode, IPS mode and the like.

(13) In the first and second embodiments described above, a configuration in which the source line is slightly bent in the vicinity of the central position in the longitudinal direction of the pixel electrode has been shown, but in addition, a specific planar shape (routing shape) of the source line can be appropriately changed. When changing the planar shape of the source line, the planar shape of the pixel electrode is preferably changed accordingly. For example, in a configuration in which the source line is linearly extended along the Y axis direction, the pixel electrode preferably has a configuration in which the long side portion is linearly extended along the Y axis direction.

(14) Other than the first and second embodiments described above, the specific planar shape of the slit provided in the common electrode can be appropriately changed. The planar shape of the slit is preferably adapted to the planar shape of the source line and the pixel electrode. Furthermore, the number of slits superimposing one pixel electrode can be appropriately changed to other than six.

(15) In the first and second embodiment described above, a case where the slit is provided on the common electrode side has been shown, but the slit can be provided on the pixel electrode side.

(16) In the first and second embodiments described above, a liquid crystal display device including a transmissive liquid crystal panel has been shown, but a liquid crystal display device including a reflective liquid crystal panel or a semi-transmissive liquid crystal panel may be adopted.

(17) In the third embodiment described above, the top emission type organic Electroluminescence display panel has been shown, but a bottom emission type organic Electroluminescence display panel in which the light emitted by the light emitting layer exits toward the array substrate side may be adopted.

(18) Other than the third embodiment described above, a specific circuit configuration for providing the signal to the anode side electrode can be appropriately changed. For example, the installing number of TFT can be changed to other than seven. Moreover, a specific planar shape (routing shape) of the anode side power supply line and the anode side electrode, a specific planar shape of each connection line and the like can be appropriately changed. Furthermore, the specific arrangement order, the planar shape and the like of the gate line, the sub-gate line, the EM line and the initialization power supply line can be appropriately changed. Moreover, which metal film to use for the sub-gate line, the EM line, the initialization power supply line, and the anode side power supply line can be appropriately changed. In addition, the low resistance region of which metal film or semiconductor film to use for each connection line can be appropriately changed.

(19) In each embodiment described above, a case where the semiconductor film includes an oxide semiconductor has been shown, but the semiconductor film may include amorphous silicon or polysilicon (LTPS).

(20) In each embodiment described above, an array substrate arranged in the liquid crystal panel and the organic Electroluminescence display panel has been illustrated, but may be an array substrate arranged in other types of display panels (EPD (microcapsule type electrophoretic display panel) etc.).

The invention claimed is:

1. An array substrate comprising:
   a semiconductor film;
   a first insulating film arranged on an upper layer side of the semiconductor film;
   a first metal film arranged on an upper layer side of the first insulating film;
   a second insulating film arranged on a lower layer side of the semiconductor film or an upper layer side of the first metal film;
   a second metal film arranged on the lower layer side with respect to the semiconductor film through the second insulating film or on the upper layer side with respect to the first metal
   film through the second insulating film;
   a gate line including the first metal film;
   a source line including the second metal film and intersecting the gate line;
   a gate electrode configuring a thin film transistor, including the first metal film and continuing to the gate line;
   a channel region configuring the thin film transistor, including a part of the semiconductor film, and being arranged to superimpose the gate electrode;
   a source region configuring the thin film transistor, being formed by reducing a resistance of a part of the semiconductor film, and continuing to the channel region;
   a drain region configuring the thin film transistor, being formed by reducing a resistance of a part of the semiconductor film, and continuing from a side opposite to the source region side with respect to the channel region; and
   a source superimposing line being formed by reducing a resistance of a part of the semiconductor film, continuing to the source region, and having at least one part arranged to superimpose the source line, the source superimposing line being connected to the source line through a plurality of contact holes opened and formed at a plurality of positions sandwiching the gate line of at least the second insulating film; wherein
   the second insulating film is arranged on the lower layer side of the semiconductor film, and the second metal film is arranged on the lower layer side with respect to the semiconductor film through the second insulating film.

2. The array substrate according to claim 1, further comprising a light shielding portion including the second metal film and being arranged to superimpose at least the channel region.

3. The array substrate according to claim 2, wherein the light shielding portion is a lower layer side gate electrode connected to the gate electrode.

4. The array substrate according to claim 1, wherein the source superimposing line includes a gate line non-superimposing portion extending along the source line and not superimposing the gate line, and a gate line superimposing portion continuing to the gate line non-superimposing portion and superimposing the gate line.

5. An array substrate comprising:
a semiconductor film;
a first insulating film arranged on an upper layer side of the semiconductor film;
a first metal film arranged on an upper layer side of the first insulating film;
a second insulating film arranged on a lower layer side of the semiconductor film or an upper layer side of the first metal film;
a second metal film arranged on the lower layer side with respect to the semiconductor film through the second insulating film or on the upper layer side with respect to the first metal
film through the second insulating film;
a gate line including the first metal film;
a source line including the second metal film and intersecting the gate line;
a gate electrode configuring a thin film transistor, including the first metal film and continuing to the gate line;
a channel region configuring the thin film transistor including a part of the semiconductor film, and being arranged to superimpose the gate electrode;
a source region configuring the thin film transistor, being formed by reducing a resistance of a part of the semiconductor film, and continuing to the channel region;
a drain region configuring the thin film transistor, being formed by reducing a resistance of a part of the semiconductor film, and continuing from a side opposite to the source region side with respect to the channel region; and
a source superimposing line being formed by reducing a resistance of a part of the semiconductor film, continuing to the source region, and having at least one part arranged to
superimpose the source line, the source superimposing line being connected to the source line through a plurality of contact holes opened and formed at a plurality of positions sandwiching the gate line of at least the second insulating film; wherein
the source superimposing line includes a gate line non-superimposing portion extending along the source line and not superimposing the gate line, and a gate line superimposing portion continuing to the gate line non-superimposing portion and superimposing the gate line; and
the source superimposing line is formed so that the gate line superimposing portion has a narrower width than the gate line non-superimposing portion.

6. The array substrate according to claim 1, wherein the source superimposing line is arranged to selectively superimpose the source line so as to not superimpose the gate line.

7. The array substrate according to claim 1, further comprising:
a pixel electrode having a long shape in which a longitudinal direction coincides with an extending direction of the source line and being connected to the drain region; wherein
at least a pair of gate lines are arranged to sandwich the pixel electrode from both sides in the longitudinal direction.

8. An array substrate comprising:
a semiconductor film;
a first insulating film arranged on an upper layer side of the semiconductor film;
a first metal film arranged on an upper layer side of the first insulating film;
a second insulating film arranged on a lower layer side of the semiconductor film or an upper layer side of the first metal film;
a second metal film arranged on the lower layer side with respect to the semiconductor film through the second insulating film or on the upper layer side with respect to the first metal
film through the second insulating film;
a gate line including the first metal film;
a source line including the second metal film and intersecting the gate line;
a gate electrode configuring a thin film transistor, including the first metal film and continuing to the gate line;
a channel region configuring the thin film transistor, including a part of the semiconductor film, and being arranged to superimpose the gate electrode;
a source region configuring the film transistor, being formed by reducing a resistance of a part of the semiconductor film, and continuing to the channel region;
a drain region configuring the thin film transistor, being formed by reducing a resistance of a part of the semiconductor film, and continuing from a side opposite to the source region side with respect to the channel region; and
a source superimposing line being formed by reducing a resistance of a part of the semiconductor film, continuing to the source region, and having at least one part arranged to
superimpose the source line, the source superimposing line being connected to the source line through a plurality of contact holes opened and formed at a plurality of positions sandwiching the gate line of at least the second insulating film; wherein
the gate line has a part of a portion not superimposing the source line and the source superimposing line formed as a wide width part having a wider width than a portion superimposing the source line and the source superimposing line; and
the source superimposing line is connected to the source line through a contact hole of the plurality of contact holes arranged at a position adjacent to the wide width part.

9. A liquid crystal panel comprising the array substrate according to claim 1.

10. An organic electroluminescence display panel comprising the array substrate according to claim 1.

11. The array substrate according to claim 5, further comprising:
a pixel electrode having a long shape in which a longitudinal direction coincides with an extending direction of the source line and being connected to the drain region; wherein
at least a pair of gate lines are arranged to sandwich the pixel electrode from both sides in the longitudinal direction.

12. A liquid crystal panel comprising the array substrate according to claim 5.

13. An organic electroluminescence display panel comprising the array substrate according to claim 5.

14. A liquid crystal panel comprising the array substrate according to claim 8.

15. An organic electroluminescence display panel comprising the array substrate according to claim 8.

* * * * *